(12) United States Patent
Matsuno et al.

(10) Patent No.: US 11,637,555 B2
(45) Date of Patent: Apr. 25, 2023

(54) SEMICONDUCTOR MEMORY DEVICE

(71) Applicant: Kioxia Corporation, Tokyo (JP)

(72) Inventors: Junya Matsuno, Yokohama Kanagawa (JP); Kensuke Yamamoto, Yokohama Kanagawa (JP); Ryo Fukuda, Yokohama Kanagawa (JP); Masaru Koyanagi, Tokyo (JP); Kenro Kubota, Fujisawa Kanagawa (JP); Masato Dome, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/588,702

(22) Filed: Jan. 31, 2022

(65) Prior Publication Data

US 2022/0158639 A1    May 19, 2022

Related U.S. Application Data

(62) Division of application No. 17/002,816, filed on Aug. 26, 2020, now Pat. No. 11,277,134.

(30) Foreign Application Priority Data

Jan. 21, 2020  (JP) ............... JP2020-007863

(51) Int. Cl.
*G11C 7/10* (2006.01)
*H03K 19/0185* (2006.01)
(Continued)

(52) U.S. Cl.
CPC ..... *H03K 19/018521* (2013.01); *G11C 7/109* (2013.01); *G11C 7/1063* (2013.01);
(Continued)

(58) Field of Classification Search
CPC ....... G11C 7/1063; G11C 7/109; G11C 7/065; G11C 7/1087; G11C 11/419; H03K 19/018521; H03K 19/018571
(Continued)

(56) References Cited

U.S. PATENT DOCUMENTS 5,304,874 A * 4/1994 Vinal .................... G11C 11/419
327/55
5,305,269 A * 4/1994 Vinal .................... G11C 7/065
327/55
(Continued)

FOREIGN PATENT DOCUMENTS

JP         4117275 B2    4/2008
JP        2010028357 A    2/2010
(Continued)

OTHER PUBLICATIONS

Notice of Allowance dated Nov. 29, 2021 issued in parent U.S. Appl. No. 17/002,816.

*Primary Examiner* — Ly D Pham
(74) *Attorney, Agent, or Firm* — Holtz, Holtz & Volek PC

(57) ABSTRACT

A semiconductor memory device includes a memory cell array and a signal propagation circuit disposed on a propagation path of a signal or a control signal. The signal propagation circuit includes a first inverted signal output circuit; a second inverted signal output circuit including an input terminal connected to an output terminal of the first inverted signal output circuit; a third inverted signal output circuit including an input terminal connected to output terminals of the first inverted signal output circuit and the second inverted signal output circuit; a fourth inverted signal output circuit including an input terminal connected to an output terminal of the third inverted signal output circuit, and further including a terminal connected to output termi-
(Continued)

nals of the third inverted signal output circuit and the fourth inverted signal output circuit.

6 Claims, 18 Drawing Sheets

(51) Int. Cl.
    *G11C 11/419*     (2006.01)
    *G11C 7/06*     (2006.01)

(52) U.S. Cl.
    CPC ..... *H03K 19/018571* (2013.01); *G11C 7/065* (2013.01); *G11C 7/1087* (2013.01); *G11C 11/419* (2013.01)

(58) Field of Classification Search
    USPC .................................................. 365/189.17
    See application file for complete search history.

(56) References Cited

U.S. PATENT DOCUMENTS

| | | | |
|---|---|---|---|
| 7,262,642 B2 | 8/2007 | Abe | |
| 7,486,112 B2 | 2/2009 | Tanaka | |
| 8,497,707 B2 | 7/2013 | Liu et al. | |
| 8,811,065 B2 * | 8/2014 | Rajan | G11C 7/10 365/150 |
| 8,917,547 B2 * | 12/2014 | Cai | G11C 11/40 365/177 |
| 8,928,399 B2 | 1/2015 | Koyanagi | |
| 9,431,322 B2 | 8/2016 | Koyanagi | |
| 9,853,013 B2 | 12/2017 | Koyanagi | |
| 10,157,894 B2 | 12/2018 | Koyanagi | |
| 10,360,982 B2 | 7/2019 | Suematsu et al. | |
| 10,461,750 B2 | 10/2019 | Hirashima et al. | |
| 10,541,231 B2 | 1/2020 | Koyanagi | |
| 10,622,074 B2 | 4/2020 | Inagaki et al. | |
| 10,679,710 B2 | 6/2020 | Hirashima et al. | |
| 10,914,642 B2 | 2/2021 | Zhao et al. | |
| 2006/0049886 A1 | 3/2006 | Agostinelli et al. | |
| 2009/0033431 A1 | 2/2009 | Yamashita et al. | |
| 2013/0228867 A1 | 9/2013 | Suematsu et al. | |
| 2019/0304906 A1 * | 10/2019 | Dorgan | H01L 27/1052 |
| 2019/0385984 A1 | 12/2019 | Koyanagi | |
| 2020/0144225 A1 | 5/2020 | Koyanagi | |

FOREIGN PATENT DOCUMENTS

| | | |
|---|---|---|
| JP | 4680004 B2 | 2/2011 |
| JP | 6295559 B2 | 3/2018 |
| JP | 2019008859 A | 1/2019 |
| JP | 2019169208 A | 10/2019 |

* cited by examiner

SEMICONDUCTOR MEMORY DEVICE

CROSS-REFERENCE TO RELATED APPLICATIONS

This application a Divisional Application of U.S. application Ser. No. 17/002,816, filed on Aug. 26, 2020, which is based upon and claims the benefit of Japanese Patent Application No. 2020-007863, filed on Jan. 21, 2020, the entire contents of all of which are incorporated herein by reference.

BACKGROUND

Field

Embodiments described herein relate to a semiconductor memory device.

Description of the Related Art

There has been known a semiconductor memory device configured to include a memory cell array and a signal propagation circuit. The memory cell array stores data. The signal propagation circuit is disposed on a propagation path of a signal corresponding to the data or a propagation path of a control signal input when a read operation or a write operation of the data is performed.

DETAILED DESCRIPTION

Figure 1:
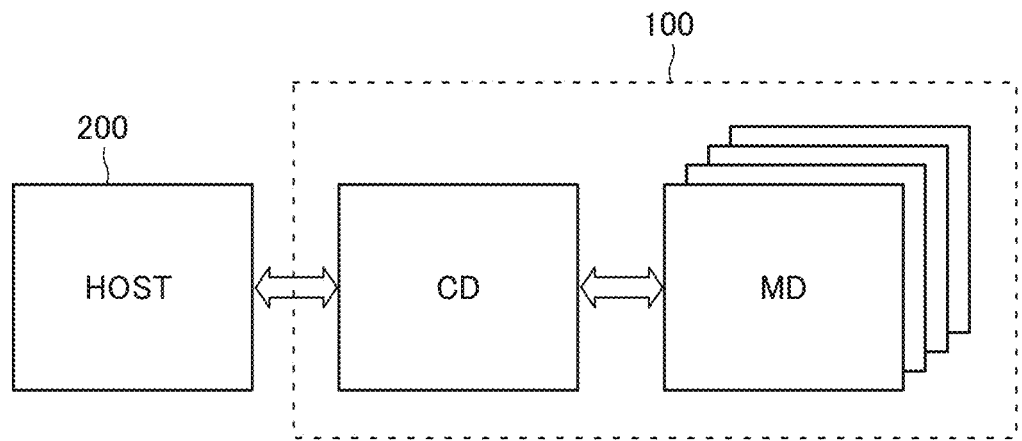
FIG. 1 is a schematic block diagram illustrating a configuration of a memory system 100 according to a first embodiment.

According to one embodiment, a semiconductor memory device comprises: a memory cell array configured to store data; and a first signal propagation circuit disposed on a propagation path of a signal corresponding to the data or a propagation path of a control signal input when a read operation or a write operation of the data is performed, wherein the first signal propagation circuit includes: a first inverted signal output circuit configured to include an odd number of cascade connected inverted signal output circuits; a second inverted signal output circuit configured to include an input terminal connected to an output terminal of the first inverted signal output circuit; a third inverted signal output circuit configured to include an odd number of cascade connected inverted signal output circuits, the third inverted signal output circuit including an input terminal connected to the output terminal of the first inverted signal output circuit and an output terminal of the second inverted signal output circuit; a fourth inverted signal output circuit configured to include an input terminal connected to an output terminal of the third inverted signal output circuit; and a fifth inverted signal output circuit configured to include an odd number of cascade connected inverted signal output circuits, the fifth inverted signal output circuit including an input terminal connected to the output terminal of the third inverted signal output circuit and an output terminal of the fourth inverted signal output circuit.

According to one embodiment, a semiconductor memory device comprises: a memory cell array configured to store data; and a first signal propagation circuit disposed on a propagation path of a signal corresponding to the data or a propagation path of a control signal input when a read operation or a write operation of the data is performed, wherein the first signal propagation circuit includes: a first inverted signal output circuit; a second inverted signal output circuit configured to include an input terminal connected to an output terminal of the first inverted signal output circuit; a third inverted signal output circuit configured to include an input terminal connected to an output terminal of the second inverted signal output circuit; a fourth inverted signal output circuit configured to include an input terminal connected to an output terminal of the third inverted signal output circuit and includes an output terminal connected to the input terminal of the second inverted signal output circuit; and a first switch circuit connected to the fourth inverted signal output circuit, the first switch circuit is connected between the output terminal of the fourth inverted signal output circuit and the input terminal of the second inverted signal output circuit, or between the fourth inverted signal output circuit and a first voltage apply line, the first switch circuit turns ON corresponding to an input of a first signal, and the first switch circuit turns OFF corresponding to an input of a second signal.

According to one embodiment, a semiconductor memory device comprises: a memory cell array configured to store data; and a first signal propagation circuit disposed on a propagation path of a signal corresponding to the data or a propagation path of a control signal input when a read operation or a write operation of the data is performed, wherein the first signal propagation circuit includes: first and second signal lines; a first inverted signal output circuit configured to include an input terminal connected to the first signal line and an output terminal connected to the second signal line; a second inverted signal output circuit configured to include an input terminal connected to the second signal line and an output terminal connected to the first signal line; a first switch circuit connected to the first inverted signal output circuit; and a second switch circuit connected to the second inverted signal output circuit, the first switch circuit is connected between the output terminal of the first inverted signal output circuit and the second signal line, or between the first inverted signal output circuit and a first voltage apply line, the second switch circuit is connected between the output terminal of the second inverted signal output circuit and the first signal line, or between the second inverted signal output circuit and the first voltage apply line, the first switch circuit and the second switch circuit turn ON corresponding to an input of a first signal, and the first switch circuit and the second switch circuit turn OFF corresponding to an input of a second signal.

Next, the semiconductor memory device according to the embodiments will be described in detail with reference to the drawings. The following embodiments are only examples, and not described for the purpose of limiting the present invention.

In this specification, when referring to that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

First Embodiment

FIG. 1 is a schematic block diagram illustrating a configuration of a memory system 100 according to the first embodiment.

The memory system 100, for example, reads, writes, and erases user data corresponding to a signal transmitted from a host computer 200. The memory system 100 is any system configured to store the user data, such as a memory chip, a memory card, and an SSD. The memory system 100 includes a plurality of memory dies MD configured to store the user data, and a control die CD connected to the plurality of memory dies MD and the host computer 200. The control die CD includes a processor, a RAM, and the like, and performs conversion between a logical address and a physical address, bit error detection/correction, a garbage collection, a wear leveling, and similar process.

Figure 2:
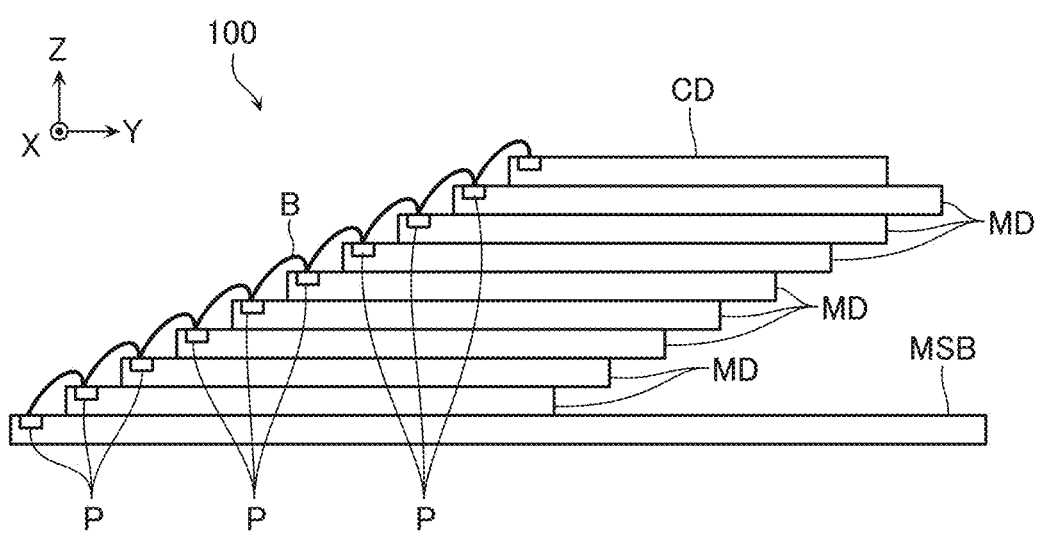
FIG. 2 is a schematic side view illustrating an exemplary configuration of the memory system 100.
Figure 3:
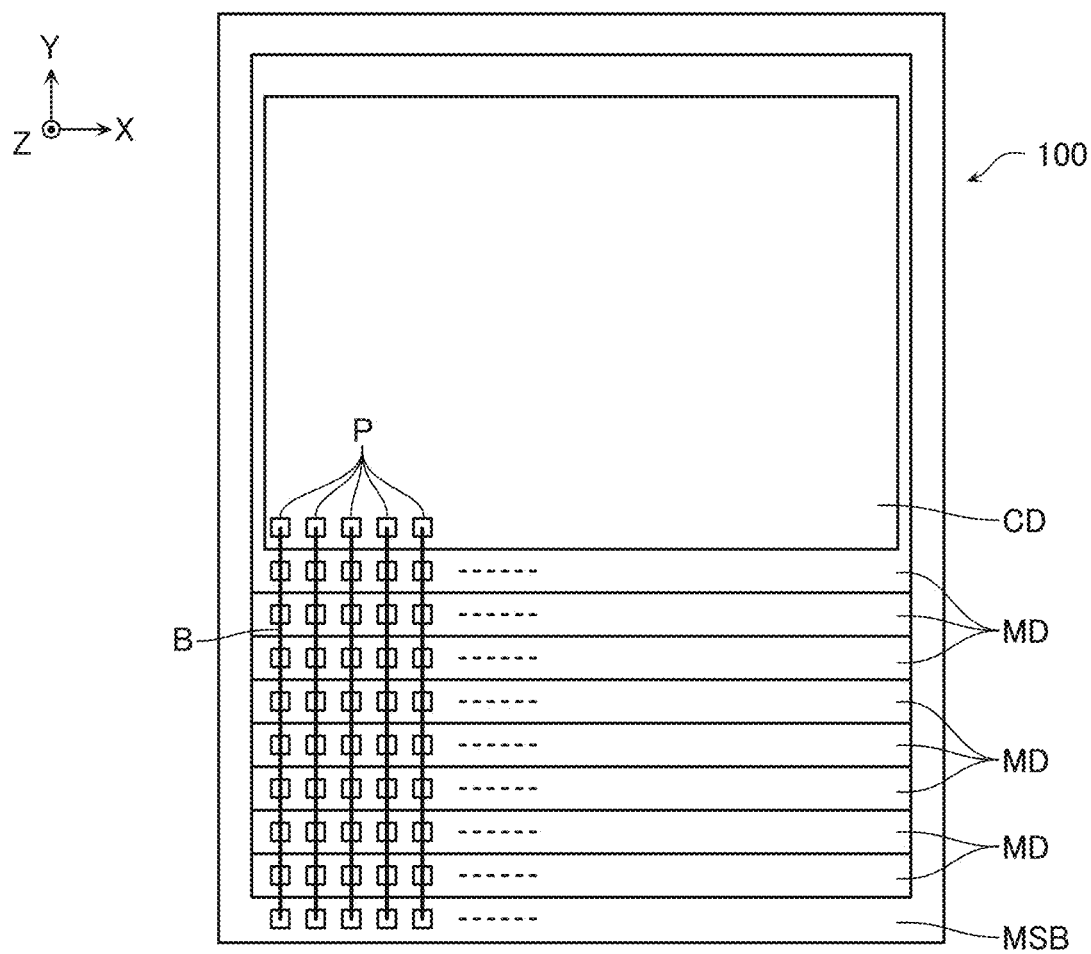
FIG. 3 is a schematic plan view illustrating the exemplary configuration.

FIG. 2 is a schematic side view illustrating an exemplary configuration of the memory system 100 according to the embodiment. FIG. 3 is a schematic plan view illustrating the exemplary configuration. For sake of convenience of explanation, FIG. 2 and FIG. 3 omit a part of the configuration.

As illustrated in FIG. 2, the memory system 100 according to the embodiment includes a mounting substrate MSB, the plurality of memory dies MD laminated on the mounting substrate MSB, and the control die CD laminated on the memory die MD. On an upper surface of the mounting substrate MSB, pad electrodes P are disposed in a region at an end portion in a Y-direction, and a part of the other region is connected to a lower surface of the memory die MD via an adhesive and the like. On an upper surface of the memory die MD, pad electrodes P are disposed in a region at an end portion in the Y-direction, and the other region is connected to a lower surface of another memory die MD or the control die CD via the adhesive and the like. On an upper surface of the control die CD, pad electrodes P are disposed in a region at an end portion in the Y-direction.

As illustrated in FIG. 3, the mounting substrate MSB, the plurality of memory dies MD, and the control die CD each include a plurality of pad electrodes P arranged in an X-direction. The plurality of pad electrodes P disposed to each of the mounting substrate MSB, the plurality of memory dies MD, and the control die CD are mutually connected via bonding wires B.

Figure 4:
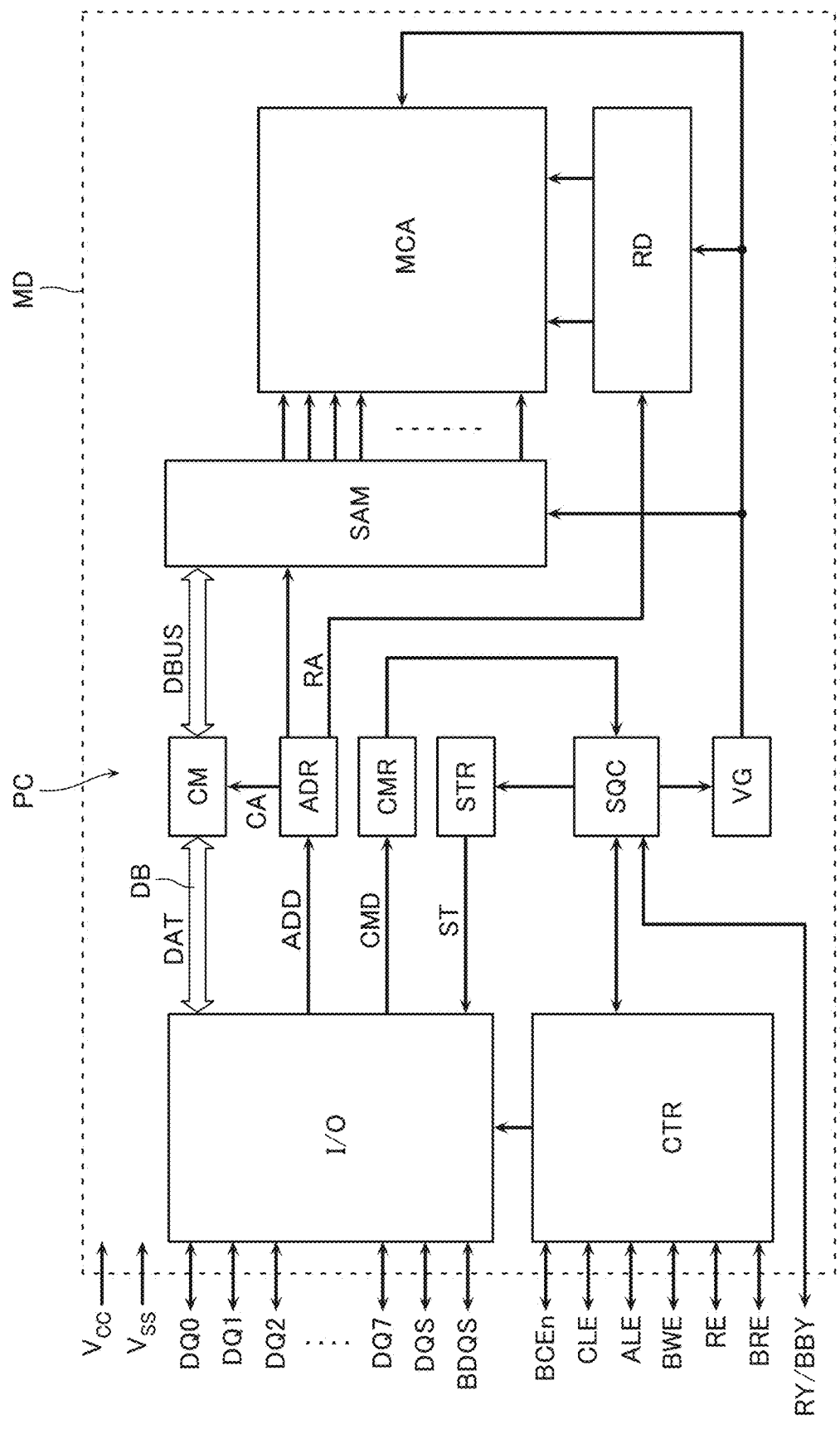
FIG. 4 is a schematic block diagram illustrating a configuration of a memory die MD.

FIG. 4 is a schematic block diagram illustrating a configuration of the memory die MD according to the first embodiment.

As illustrated in FIG. 4, the memory die MD includes a memory cell array MCA configured to store data and a peripheral circuit PC connected to the memory cell array MCA.

The memory cell array MCA includes a plurality of bit lines, a plurality of word lines, and memory cells connected to the plurality of bit lines and the plurality of word lines. The plurality of memory cells store data of one bit or a plurality of bits. Various configurations are applicable to the memory cell array. For example, the memory cell array may include a memory transistor including an electric charge accumulating film, a ferroelectric film, or another memory film as a gate insulating film and a threshold voltage of the memory transistor varies corresponding to a write operation. The memory cell array MCA may be a phase change memory configured to include a chalcogenide film of GeSbTe and the like, and a crystalline state of the chalcogenide film varies corresponding to a write operation. The memory cell array MCA may be a MRAM configured to include a pair of mutually opposing ferromagnetic films and a tunnel insulating film disposed between the ferromagnetic films, and magnetization directions of the ferromagnetic films vary corresponding to a write operation. The memory cell array MCA may be a ReRAM configured to include a pair of electrodes and a metal oxide and the like disposed between these electrodes, and the electrodes are mutually electrically conducted via a filament and the like with oxygen defect and the like corresponding to write operation. The memory cell array MCA may be a DRAM configured to include a capacitor and a transistor and performs charge and discharge to the capacitor during a write operation and a read operation. The memory cell array MCA may have other configurations.

The peripheral circuit PC includes, for example, a voltage generation circuit VG, a row decoder RD, a sense amplifier module SAM, and a sequencer SQC. The peripheral circuit PC includes a cache memory CM, an address register ADR, a command register CMR, and a status register STR. The peripheral circuit PC includes an input/output control circuit I/O and a logic circuit CTR.

The voltage generation circuit VG includes, for example, a step down circuit, such as a regulator, and a step up circuit, such as a charge pump circuit. The step down circuit, the step up circuit, and the like are each connected to terminals to which an apply voltage $V_{CC}$ and a ground voltage $V_{SS}$ are applied. These terminals are achieved by, for example, the pad electrodes P described with reference to FIG. 2 and FIG. 3. The voltage generation circuit VG, for example, generates a plurality of operating voltages applied to the bit lines, the word lines, and the like in a read operation, a write operation, and an erase operation to the memory cell array MCA in accordance with a control signal from the sequencer SQC, and simultaneously outputs the plurality of operating voltages to a plurality voltage apply lines. The operating voltage output from the voltage apply line is appropriately adjusted in accordance with the control signal from the sequencer SQC.

The row decoder RD includes, for example, an address decoder configured to decode address data ADD and a switch circuit configured to electrically conduct the word lines in the memory cell array MCA to the voltage apply line as necessary in accordance with the output signal of the address decoder.

The sense amplifier module SAM includes a plurality of sense amplifier units connected to the plurality of bit lines in the memory cell array MCA. The sense amplifier units each include a sense circuit and a switch circuit connected to the bit line, and a latch circuit connected to the sense circuit and the switch circuit. The latch circuit latches read data read out from the memory cell and write data to be written to the memory cell. The sense circuit latches data corresponding to the magnitude of the voltage or the current of the bit line as the read data in the latch circuit during the read operation and the like. The switch circuit electrically conducts the voltage apply lines corresponding to the respective bits of the write data to the bit lines corresponding to the write data latched in the latch circuit during the write operation and the like.

The cache memory CM is connected to the latch circuit in the sense amplifier module SAM via a data bus DBUS. The cache memory CM includes a plurality of latch circuits corresponding to the plurality of latch circuits in the sense amplifier module SAM. The read data and the write data are latched in the cache memory CM.

The sense amplifier module SAM or the cache memory CM includes a decode circuit and a switch circuit (not illustrated). The decode circuit decodes a column address CA held in the address register ADR. The switch circuit may electrically conduct the latch circuit corresponding to the column address CA to a bus DB in accordance with an output signal of the decode circuit. The switch circuit may electrically conduct the bit line corresponding to the column address CA to the sense amplifier unit in accordance with an output signal of the decode circuit.

The sequencer SQC sequentially decodes command data CMD held in the command register CMR and outputs an internal control signal to the row decoder RD, the sense amplifier module SAM, and the voltage generation circuit VG. The sequencer SQC outputs status data indicating its own state to the status register STR as necessary. The sequencer SQC generates a ready/busy signal and outputs the ready/busy signal to a terminal RY/BBY. The terminal RY/BBY is achieved by, for example, the pad electrode P described with reference to FIG. 2 and FIG. 3.

The input/output control circuit I/O includes data signal input/output terminals DQ0 to DQ7, clock signal input/output terminals DQS, BDQS, an input circuit, such as a comparator, and an output circuit, such as an OCD circuit. The input circuit and the output circuit are connected to the data signal input/output terminals DQ0 to DQ7. The input/output control circuit I/O includes a shift register and a buffer circuit connected to the input circuit and the output circuit. The data signal input/output terminals DQ0 to DQ7 and the clock signal input/output terminals DQS, BDQS are achieved by, for example, the pad electrodes P described with reference to FIG. 2 and FIG. 3. Data input via the data signal input/output terminals DQ0 to DQ7 is output from the buffer circuit to the cache memory CM, the address register ADR, or the command register CMR in accordance with the internal control signal from the logic circuit CTR. Data output via the data signal input/output terminals DQ0 to DQ7 is input to the buffer circuit from the cache memory CM or the status register STR in accordance with the internal control signal from the logic circuit CTR.

The logic circuit CTR receives an external control signal from the control die CD via external control terminals BCEn, CLE, ALE, BWE, RE, and BRE, and outputs the internal control signal to the input/output control circuit I/O in accordance with the external control signal. The external control terminals BCEn, CLE, ALE, BWE, RE, and BRE are achieved by, for example, the pad electrodes P described with reference to FIG. 2 and FIG. 3.

The external control terminal BCEn is used for selecting the memory die MD. The input/output control circuit I/O of the memory die MD having the external control terminal BCEn to which "L" is input performs an input/output of the data via the data signal input/output terminals DQ0 to DQ7. The input/output control circuit I/O of the memory die MD having the external control terminal BCEn to which "H" is input does not perform the input/output of the data via the data signal input/output terminals DQ0 to DQ7.

The external control terminal CLE is used for the use of the command register CMR. When "H" is input to the external control terminal CLE, the data input via the data signal input/output terminals DQ0 to DQ7 is stored as command data CMD in a buffer memory in the input/output control circuit I/O, and transferred to the command register CMR.

The external control terminal ALE is used for the use of the address register ADR. When "H" is input to the external control terminal ALE, the data input via the data signal input/output terminals DQ0 to DQ7 is stored as address data ADD in the buffer memory in the input/output control circuit I/O, and transferred to the address register ADR.

When "L" is input to both the external control terminals CLE and ALE, the data input via the data signal input/output terminals DQ0 to DQ7 is stored as user data DAT in the buffer memory in the input/output control circuit I/O, and transferred to the cache memory CM via the bus DB.

The external control terminal BWE is used in the input of the data via the data signal input/output terminals DQ0 to DQ7. The data input via the data signal input/output terminals DQ0 to DQ7 is retrieved in the shift register in the input/output control circuit I/O at a timing of a voltage rise (switching of input signal) of the external control terminal BWE.

The clock signal input/output terminals DQS, BDQS are used in the input of the data via the data signal input/output terminals DQ0 to DQ7. The data input via the data signal input/output terminals DQ0 to DQ7 is retrieved in the shift register in the input/output control circuit I/O at a timing of a voltage rise (switching of input signal) of the clock signal input/output terminal DQS and a voltage fall (switching of input signal) of the clock signal input/output terminal BDQS, and a timing of a voltage fall (switching of input signal) of the clock signal input/output terminal DQS and a voltage rise (switching of input signal) of the clock signal input/output terminal BDQS.

In the input of the data, the external control terminal BWE may be used, or the clock signal input/output terminals DQS, BDQS may be used.

The external control terminals RE, BRE are used in the output of the data via the data signal input/output terminals DQ0 to DQ7. The data output from the data signal input/output terminals DQ0 to DQ7 is switched at a timing of a voltage fall (switching of input signal) of the external control terminal RE and a voltage rise (switching of input signal) of the external control terminal BRE, and a timing of a voltage rise (switching of input signal) of the external control terminal RE and a voltage fall (switching of input signal) of the external control terminal BRE.

Figure 5:
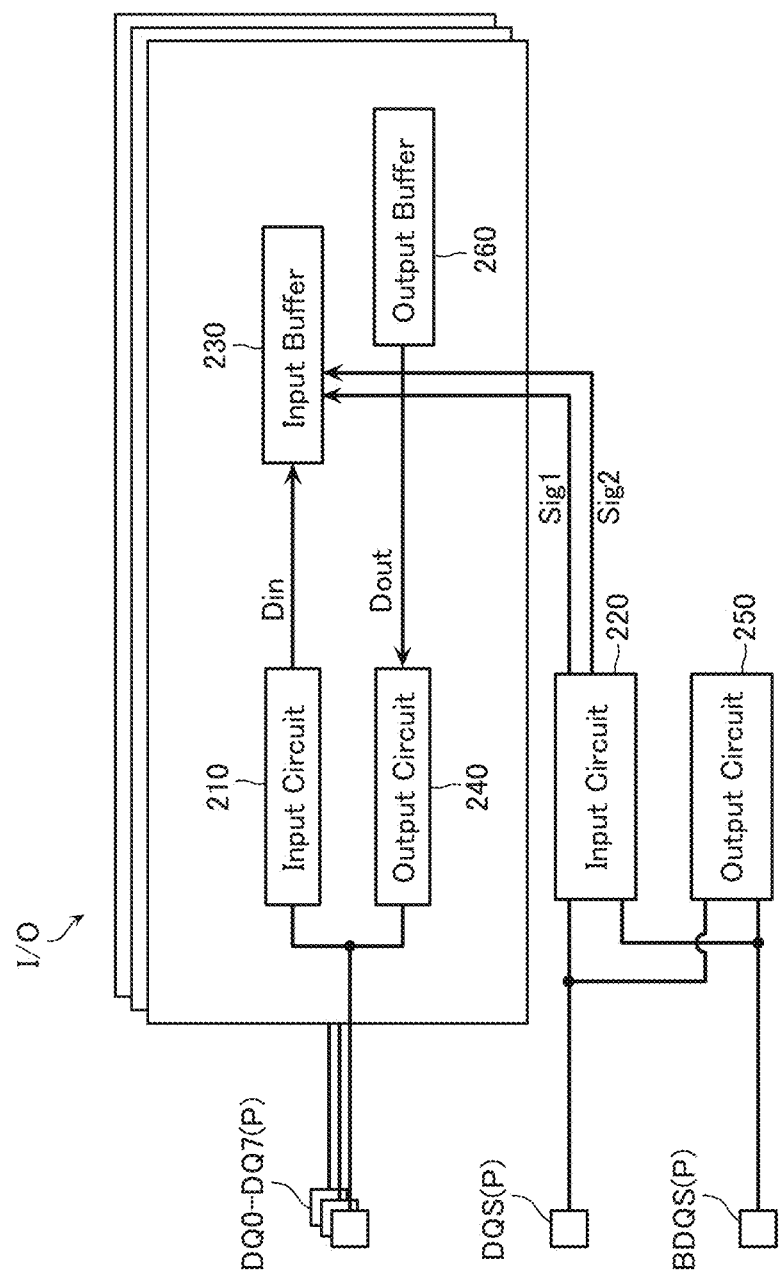
FIG. 5 is a schematic block diagram illustrating a configuration of a part of an input/output control circuit I/O.

FIG. 5 is a schematic block diagram illustrating a configuration of a part of the input/output control circuit I/O.

Figure 6:
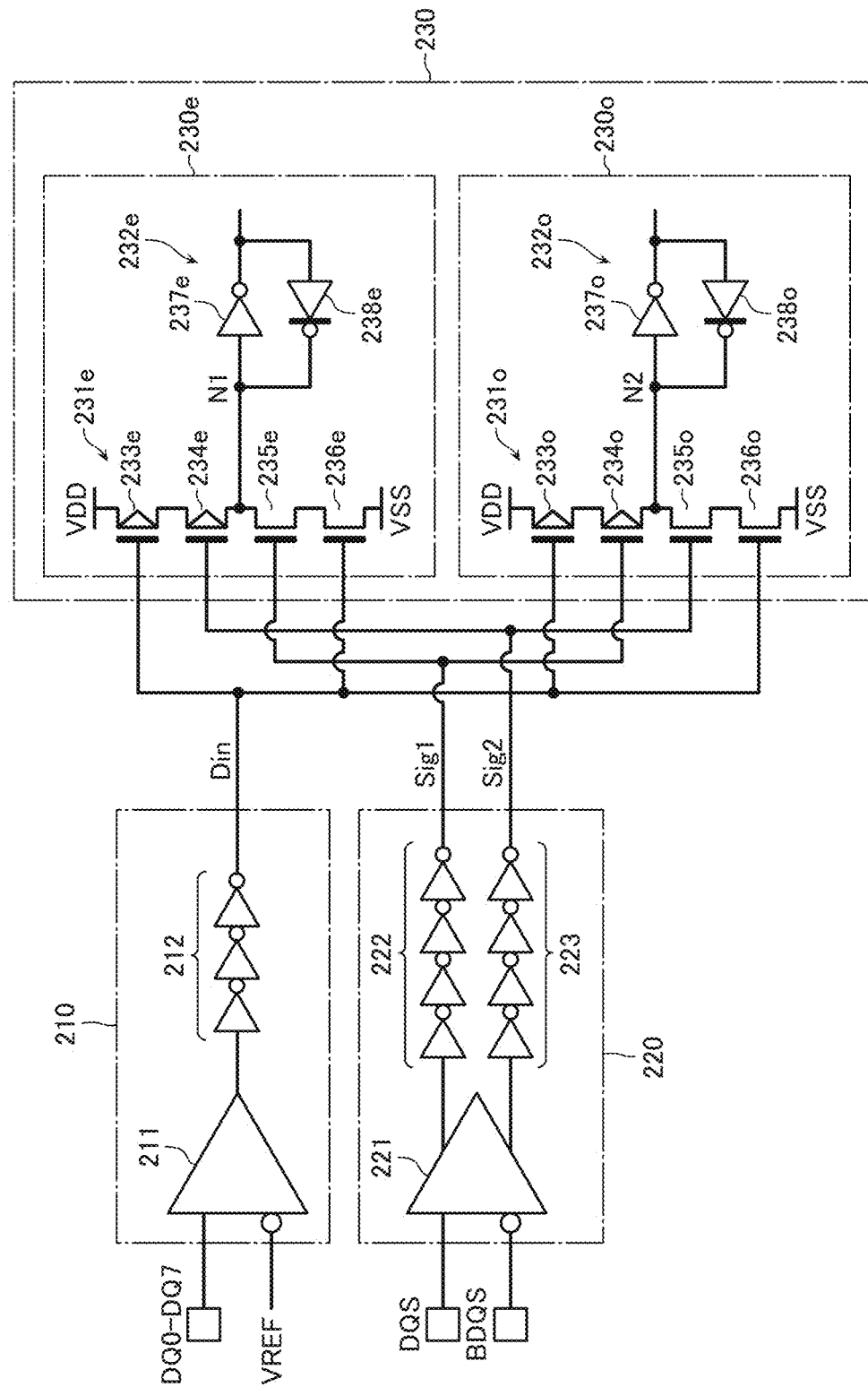
FIG. 6 is a schematic circuit diagram illustrating a configuration of a part of the input/output control circuit I/O.
Figure 7:
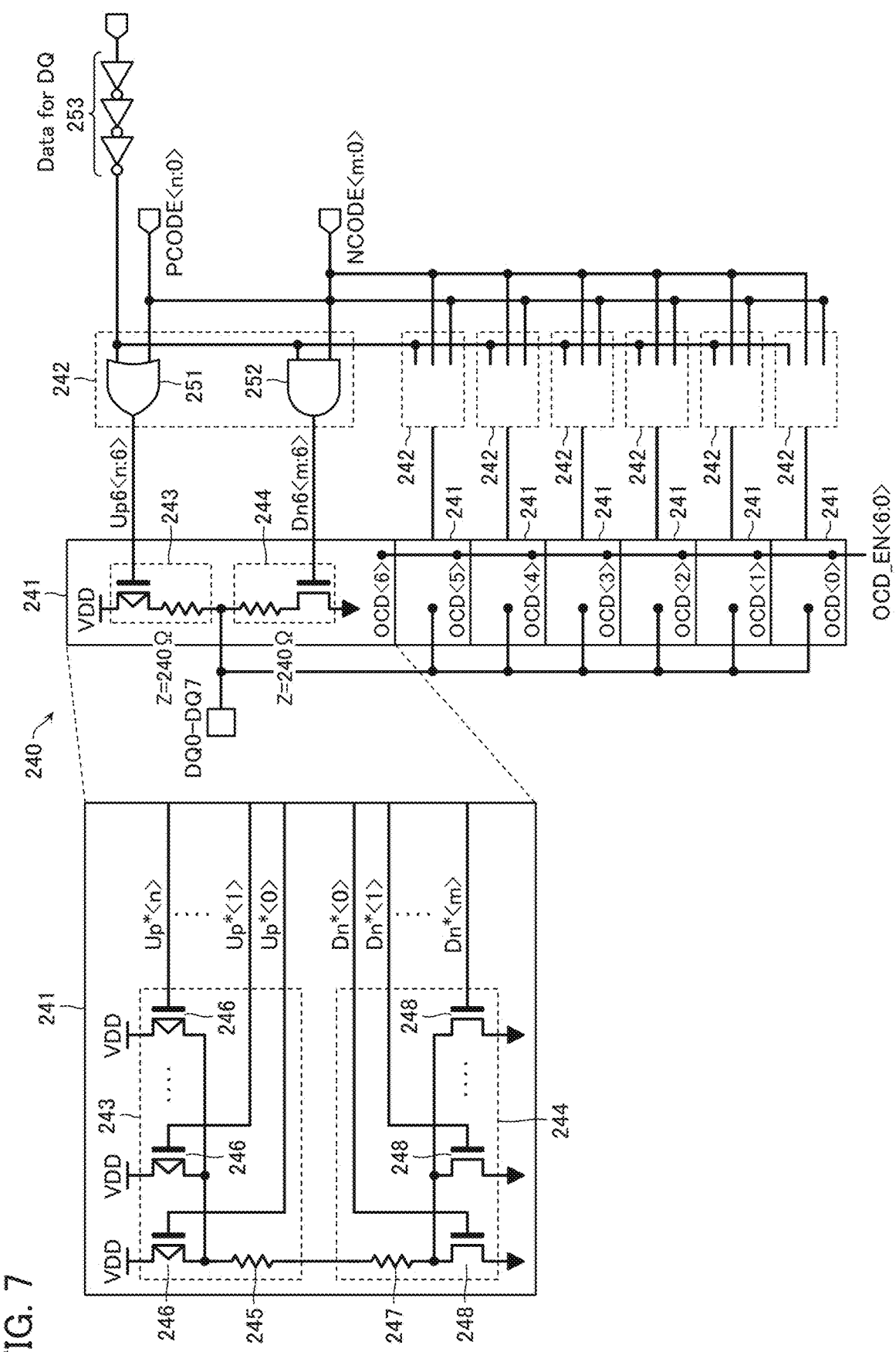
FIG. 7 is a schematic circuit diagram illustrating a configuration of a part of the input/output control circuit I/O.

FIG. 6 and FIG. 7 are schematic circuit diagrams illustrating the configurations of a part of the input/output control circuit I/O.

For example, as illustrated in FIG. 5, the input/output control circuit I/O includes a plurality of input circuits 210 connected to the data signal input/output terminals DQ0 to DQ7, input circuits 220 connected to the clock signal input/output terminals DQS, BDQS, and input buffer circuits 230 connected to the input circuits 210, 220.

For example, as illustrated in FIG. 6, the input circuit 210 includes a comparator 211 connected to any of the data signal input/output terminals DQ0 to DQ7 and a signal propagation circuit 212 configured to propagate the output signal of the comparator 211. The comparator 211 has one input terminal connected to any of the data signal input/output terminals DQ0 to DQ7, and the other input terminal connected to a voltage apply line configured to apply a reference voltage VREF. The signal propagation circuit 212 propagates the output signal of the comparator 211. A signal Din propagated by the signal propagation circuit 212 is a signal corresponding to the data and the like input via the data signal input/output terminals DQ0 to DQ7.

For example, as illustrated in FIG. 6, the input circuit 220 includes a comparator 221 connected to the clock signal input/output terminals DQS, BDQS, and signal propagation circuits 222, 223 configured to propagate the output signal of the comparator 221. The comparator 221 has one input terminal connected to the clock signal input/output terminal DQS, and the other input terminal connected to the clock signal input/output terminal BDQS. The signal propagation circuits 222, 223 propagate the output signal of the comparator 221. Signals Sig1, Sig2 propagated by the signal propagation circuits 222, 223 are clock signals input via the clock signal input/output terminals DQS, BDQS. The signal Sig2 is an inverted signal of the signal Sig1.

For example, as illustrated in FIG. 6, the input buffer circuit 230 includes a circuit element 230e configured to latch even-numbered data and a circuit element 230o configured to latch odd-numbered data.

The circuit element 230e includes a clocked inverter 231e and a latch circuit 232e. The clocked inverter 231e includes PMOS transistors 233e, 234e and NMOS transistors 235e, 236e. The PMOS transistors 233e, 234e are connected in series between a voltage apply line configured to apply a voltage VDD and an output terminal N1. The NMOS transistors 235e, 236e are connected in series between the output terminal N1 and a voltage apply line configured to apply the ground voltage VSS. The PMOS transistor 233e has a gate electrode connected to an output terminal of the signal propagation circuit 212. The PMOS transistor 234e has a gate electrode connected to an output terminal of the signal propagation circuit 223. The NMOS transistor 235e has a gate electrode connected to an output terminal of the signal propagation circuit 222. The NMOS transistor 236e has a gate electrode connected to the output terminal of the signal propagation circuit 212. The latch circuit 232e includes inverters 237e, 238e. An input terminal of the inverter 237e and an output terminal of the inverter 238e are connected to the output terminal N1 of the clocked inverter 231e. An output terminal of the inverter 237e and an input terminal of the inverter 238e are connected to a circuit (not illustrated), such as a FIFO buffer.

The circuit element 230o includes a clocked inverter 231o and a latch circuit 232o. The clocked inverter 2310 includes PMOS transistors 233o, 234o and NMOS transistors 235o, 236o. The PMOS transistors 233o, 234o are connected in series between the voltage apply line configured to apply the voltage VDD and an output terminal N2. The NMOS transistors 235*o*, 236*o* are connected in series between an output terminal N2 and the voltage apply line configured to apply the ground voltage VSS. The PMOS transistor 233*o* has a gate electrode connected to the output terminal of the signal propagation circuit 212. The PMOS transistor 234*o* has a gate electrode connected to the output terminal of the signal propagation circuit 222. The NMOS transistor 235*o* has a gate electrode connected to the output terminal of the signal propagation circuit 223. The NMOS transistor 236*o* has a gate electrode connected to the output terminal of the signal propagation circuit 212. The latch circuit 232*o* includes inverters 237*o*, 238*o*. An input terminal of the inverter 237*o* and an output terminal of the inverter 238*o* are connected to the output terminal N2 of the clocked inverter 231*o*. An output terminal of the inverter 237*o* and an input terminal of the inverter 238*o* are connected to a circuit (not illustrated), such as a FIFO buffer.

For example, as illustrated in FIG. 5, the input/output control circuit I/O includes a plurality of output circuits 240 connected to the data signal input/output terminals DQ0 to DQ7, a plurality of output circuits 250 connected to the clock signal input/output terminals DQS, BDQS, and output buffer circuits 260 connected to the output circuit 240.

For example, as illustrated in FIG. 7, the output circuit 240 includes seven OCD units 241 connected to the respective data signal input/output terminals DQ0 to DQ7 in parallel, and seven OCD unit control circuits 242 connected to the seven OCD units 241.

The seven OCD units 241 each have, for example, an impedance of 240Ω. The seven OCD units 241 are each connected to a signal line OCD_EN<6:0>, and the number of the OCD units 241 to be driven is controlled corresponding to the signal line OCD_EN<6:0>. For example, when a signal 0000001 (01 in hexadecimal) is input to the signal line OCD_EN<6:0>, the one OCD unit 241 is driven to set an impedance $Z_{DRV}$ of the output circuit 240 to approximately 240Ω. For example, when a signal 0011111 (1F in hexadecimal) is input to the signal line OCD_EN<6:0>, the five OCD units 241 are driven to set the impedance $Z_{DRV}$ of the output circuit 240 to approximately 240Ω/5=48Ω. The signal of the signal line OCD_EN<6:0> is controlled by, for example, a user.

The OCD units 241 each include a pull-up circuit 243 connected between the voltage apply line configured to apply the voltage VDD and any of the data signal input/output terminals DQ0 to DQ7. The OCD units 241 each include a pull-down circuit 244 connected between any of the data signal input/output terminals DQ0 to DQ7 and the voltage apply line configured to apply the ground voltage VSS.

The pull-up circuit 243 includes a resistive element 245 connected to any of the data signal input/output terminals DQ0 to DQ7, and n+1 (n is a natural number) transistors 246 connected between the resistive element 245 and the voltage apply line configured to apply the voltage VDD in parallel. The transistor 246 is a PMOS transistor. The n+1 transistors 246 have at least one of mutually different channel widths and mutually different channel lengths, and have mutually different n+1 resistance values. Gate electrodes of the n+1 transistors 246 are connected to respective signal lines Up*<0> to Up*<n> (* is any of 0 to 6). Data of n+1 bits input to the signal lines Up*<0> to Up*<n> is adjusted to have the impedance at the driving of the pull-up circuit 243 of approximately 240Ω.

The pull-down circuit 244 includes a resistive element 247 connected to any of the data signal input/output terminals DQ0 to DQ7, and m+1 (m is a natural number) transistors 248 connected between the resistive element 247 and the voltage apply line configured to apply the ground voltage VSS in parallel. The transistor 248 is a NMOS transistor. The m+1 transistors 248 have at least one of mutually different channel widths and mutually different channel lengths, and have mutually different m+1 resistance values. Gate electrodes of the m+1 transistors 248 are connected to respective signal lines Dn*<0> to Dn*<m> (* is any of 0 to 6). Data of m+1 bits input to the signal lines Dn*<0> to Dn*<m> is adjusted to have the impedance at the driving of the pull-down circuit 244 of approximately 240Ω.

The OCD unit control circuit 242 includes, for example, n+1 OR circuits 251 and m+1 AND circuits 252.

The n+1 OR circuits 251 include one input terminal connected to an output terminal of a signal propagation circuit 253. The signal propagation circuit 253 propagates a signal of "1" or "0" output from the data signal input/output terminal DQ0 to DQ7. The n+1 OR circuits 251 include the other input terminal to which a corresponding bit in n+1 bit data PCODE<n:0> corresponding to the n+1 transistors 246 included in the pull-up circuit 243 is input. The n+1 OR circuits 251 include output terminals each connected to the gate electrode of the corresponding transistor 246.

The m+1 AND circuits 252 include one input terminal connected to the output terminal of the signal propagation circuit 253. The m+1 AND circuits 252 include the other input terminal to which a corresponding bit in m+1 bit data NCODE<m:0> corresponding to the m+1 transistors 248 included in the pull-down circuit 244 is input. The m+1 AND circuits 252 include output terminals each connected to the gate electrode of the corresponding transistor 248.

The output circuit 250 of FIG. 5 is basically configured similarly to the output circuit 240. The output circuit 250 includes seven OCD units 241 connected to the clock signal input/output terminals DQS, BDQS in parallel, and seven OCD unit control circuits 242 connected to the seven OCD units 241. Note that the OCD units 241 include output terminals connected to not any of the data signal input/output terminals DQ0 to DQ7 but the clock signal input/output terminal DQS or the clock signal input/output terminal BDQS. The signal propagation circuit 253 propagates not the signal of "1" or "0" output from the data signal input/output terminal DQ0 to DQ7 but clock signals output from the clock signal input/output terminals DQS, BDQS.

Figure 8:
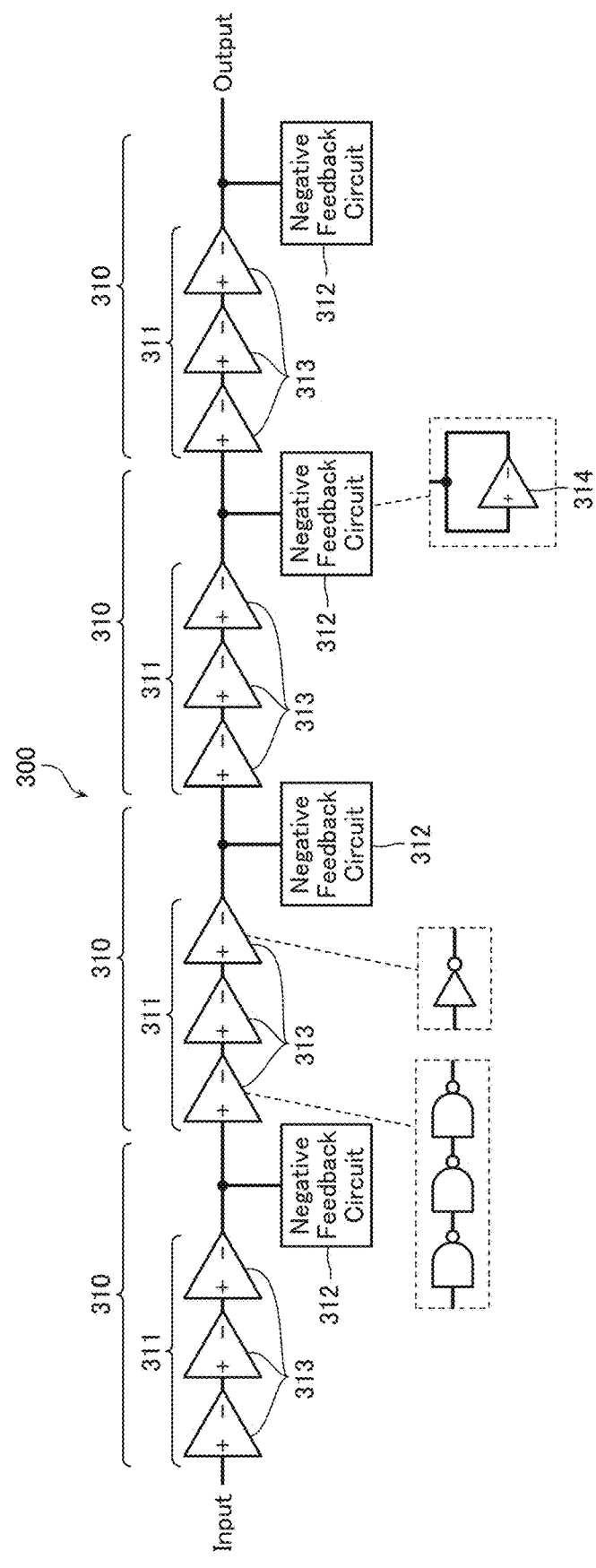
FIG. 8 is a schematic circuit diagram illustrating a configuration of a signal propagation circuit 300 according to the first embodiment.

FIG. 8 is a schematic circuit diagram illustrating a configuration of a signal propagation circuit 300 according to the embodiment. The signal propagation circuit 300 may be any of the signal propagation circuits 212, 222, and 223 described with reference to FIG. 6, may be the signal propagation circuit 253 described with reference to FIG. 7, or may be another signal propagation circuit (not illustrated) included in the input/output control circuit I/O described with reference to FIG. 5 or the logic circuit CTR.

The signal propagation circuit 300 includes a plurality of cascade connected signal propagation circuits 310. The signal propagation circuits 310 each include an inverted signal output circuit 311 and a negative feedback circuit 312 connected to an output terminal of the inverted signal output circuit 311.

The inverted signal output circuit 311 includes an odd number of cascade connected inverting amplifier circuits 313. The inverting amplifier circuit 313 may be, for example, a CMOS inverter, or may be a NAND circuit, a NOR circuit, and the like. The inverting amplifier circuit 313 may include, for example, a PMOS transistor connected between the voltage apply line configured to apply the voltage VDD and an output terminal, and a NMOS transistor connected between the output terminal and the voltage apply line configured to apply the ground voltage VSS in series. Gate electrodes of the PMOS transistor and the NMOS transistor may be connected to an input terminal of the inverting amplifier circuit 313.

The negative feedback circuit 312 includes an inverted signal output circuit 314 whose input terminal and output terminal are connected to the output terminal of the inverted signal output circuit 311. The inverted signal output circuit 314 includes one or an odd number of cascade connected inverting amplifier circuits. The inverting amplifier circuit may be, for example, a CMOS inverter, or may be a NAND circuit, a NOR circuit, and the like. The inverting amplifier circuit may include, for example, a PMOS transistor connected between the voltage apply line configured to apply the voltage VDD and an output terminal, and a NMOS transistor connected between the output terminal and the voltage apply line configured to apply the ground voltage VSS in series. Gate electrodes of the PMOS transistor and the NMOS transistor may be connected to an input terminal of the inverting amplifier circuit. The negative feedback circuit 312 has a driving force smaller than a driving force of the inverted signal output circuit 311. This configuration can be achieved by the adjustment of the number of transistors to be used, the channel width, and the like.

Output Signal of Signal Propagation Unit 310

Figure 9:
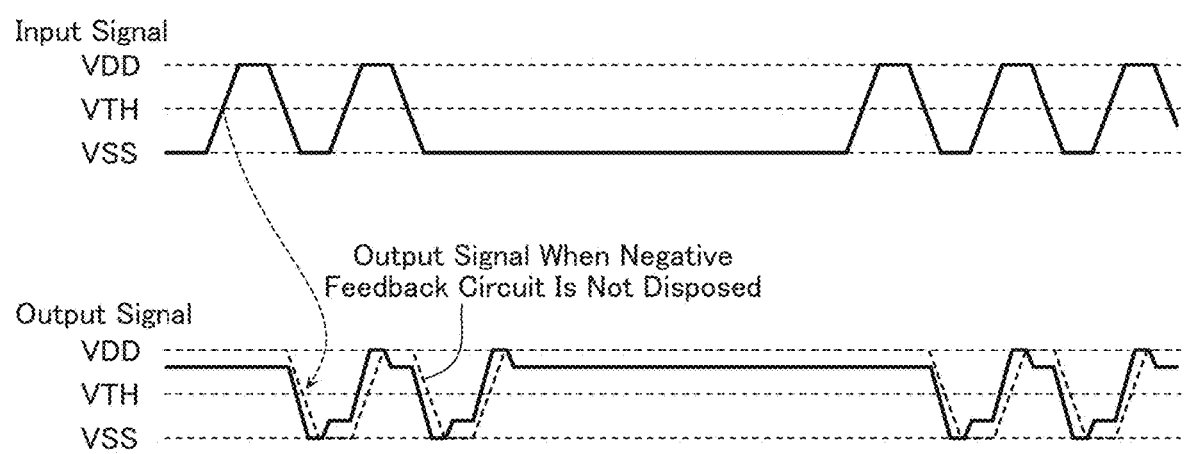
FIG. 9 is a schematic waveform diagram illustrating an input signal and an output signal of a signal propagation circuit 310.

FIG. 9 is a schematic waveform diagram illustrating an input signal and an output signal of the signal propagation circuit 310. In FIG. 9, manufacturing errors of the transistor and the like, attenuation of the signal waveform, or the like are not considered.

When the input signal is "L," the inverted signal output circuit 311 outputs "H," and the negative feedback circuit 312 outputs "L." Here, an amplitude of the output signal of the negative feedback circuit 312 is smaller than an amplitude of the signal of the inverted signal output circuit 311. Accordingly, an output voltage of the signal propagation circuit 310 is a voltage between a voltage corresponding to the ordinary "H" state (for example, voltage approximately same as the voltage VDD) and a threshold voltage VTH of the inverted signal output circuit 311.

In a predetermined time period after the switching of the input signal from "L" to "H," the inverted signal output circuit 311 outputs "L" and the negative feedback circuit 312 outputs "L." Accordingly, the output voltage of the signal propagation circuit 310 is a voltage corresponding to the ordinary "L" state (for example, voltage approximately same as the ground voltage VSS).

After the elapse of the predetermined time period after the switching of the input signal from "L" to "H," the inverted signal output circuit 311 outputs "L" and the negative feedback circuit 312 outputs "H." Accordingly, the output voltage of the signal propagation circuit 310 is a voltage between the voltage corresponding to the ordinary "L" state and the threshold voltage VTH of the inverted signal output circuit 311.

In a predetermined time period after the switching of the input signal from "H" to "L," the inverted signal output circuit 311 outputs "H" and the negative feedback circuit 312 outputs "H." Accordingly, the output voltage of the signal propagation circuit 310 is the voltage corresponding to the ordinary "H" state.

After the elapse of the predetermined time period after the switching of the input signal from "H" to "L," the inverted signal output circuit 311 outputs "H" and the negative feedback circuit 312 outputs "L." Accordingly, the output voltage of the signal propagation circuit 310 is a voltage between the voltage corresponding to the ordinary "H" state and the threshold voltage VTH of the inverted signal output circuit 311.

Comparative Example

Figure 10:
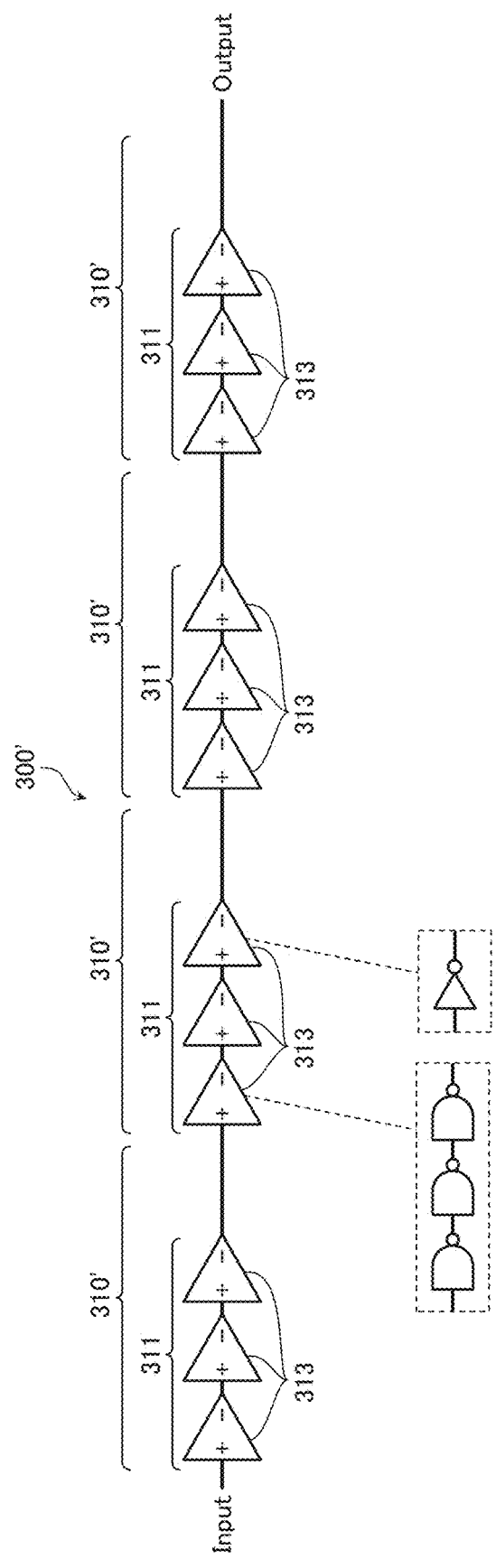
FIG. 10 is a schematic circuit diagram illustrating a configuration of a signal propagation circuit 300' according to a comparative example.

FIG. 10 is a schematic circuit diagram illustrating a configuration of a signal propagation circuit 300' according to the comparative example. The signal propagation circuit 300' includes a signal propagation circuit 310' instead of the signal propagation circuit 310. The signal propagation circuit 310' is basically configured similarly to the signal propagation circuit 310. However, the signal propagation circuit 310' does not include the negative feedback circuit 312.

Figure 11:
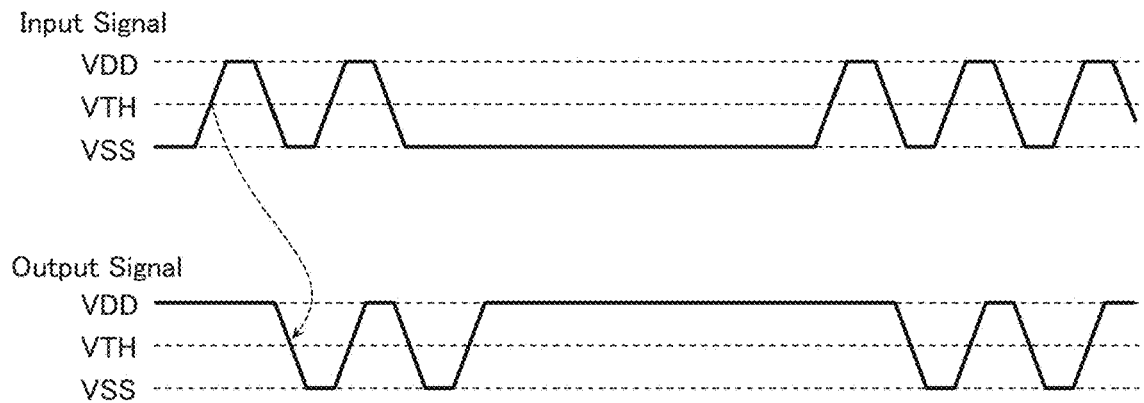
FIG. 11 is a schematic waveform diagram illustrating an input signal and an output signal of a signal propagation circuit 310'.

FIG. 11 is a schematic waveform diagram illustrating an input signal and an output signal of the signal propagation circuit 310'. In FIG. 11, manufacturing errors of the transistor and the like, attenuation of the signal waveform, or the like are not considered. In the illustrated example, the inverted signal output circuit 311 outputs an inverted signal of the input signal.

Figure 12:
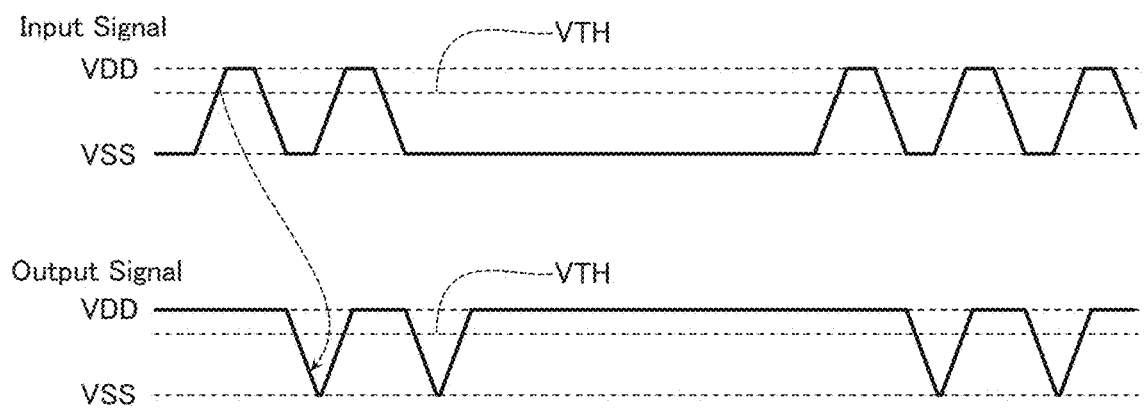
FIG. 12 is a schematic waveform diagram illustrating the input signal and the output signal of the signal propagation circuit 310'.

FIG. 12 is a schematic waveform diagram illustrating the input signal and the output signal of the signal propagation circuit 310'. The waveform diagram of FIG. 12 is a waveform diagram when the threshold voltage VTH of the inverted signal output circuit 311 is biased due to the manufacturing error of the transistor and the like. In the illustrated example, the threshold voltage VTH of the inverted signal output circuit 311 is larger than a design value. Consequently, a time period in which the output signal is in the "L" state is shorter than a time period in which the input signal is in the "H" state.

Here, for example, a case where the waveform of the input signal is blunted due to the attenuation of the signal and the like, and a case where the manufacturing error of the transistor and the like is larger, the waveform of the output signal of the inverted signal output circuit 311 is further blunted, and the signal is possibly lost in the signal propagation circuit 300'.

Effect of Semiconductor Memory Device According to First Embodiment

Figure 13:
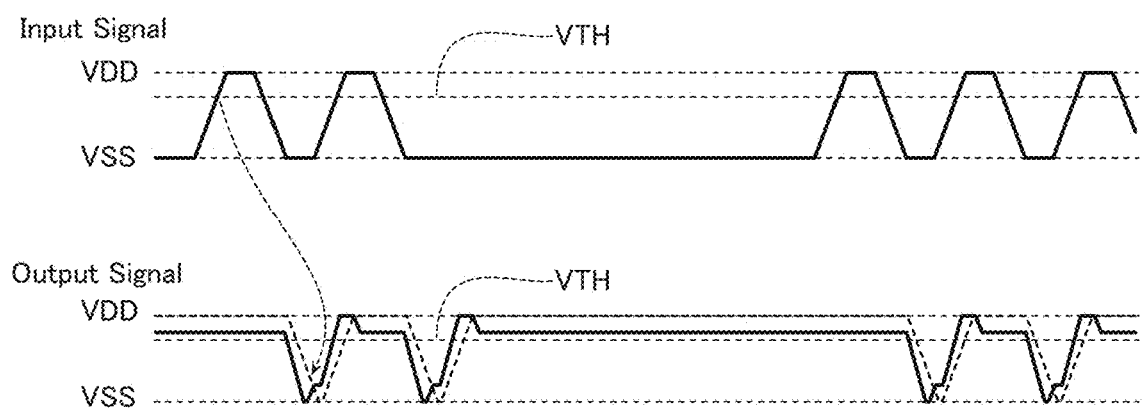
FIG. 13 is a schematic waveform diagram illustrating the input signal and the output signal of the signal propagation circuit 310.

FIG. 13 is a schematic waveform diagram illustrating the input signal and the output signal of the signal propagation circuit 310 according to the first embodiment. The waveform diagram of FIG. 13 is a waveform diagram when the threshold voltage VTH of the inverted signal output circuit 311 is biased due to the manufacturing error of the transistor and the like.

As described above, the output signal of the signal propagation circuit 310 according to the first embodiment has the voltage between the voltage corresponding to the ordinary "H" state and the threshold voltage VTH of the inverted signal output circuit 311 in the case of the input signal "L." Accordingly, the switching of the input signal from "L" to "H" causes the output signal of the signal propagation circuit 310 to start to drop from the voltage relatively close to the threshold voltage VTH. Thus, the output signal of the signal propagation circuit 310 can be quickly reached to the threshold voltage VTH compared with the comparative example. An electric charge of the output terminal of the inverted signal output circuit 311 can be discharged at a high speed via the configuration of the NMOS transistor and the like included in the negative feedback circuit 312. Accordingly, the output signal of the signal propagation circuit 310 can be dropped at a high speed compared with the comparative example. Thus, the loss of the signal as described above can be reduced.

The output signal of the signal propagation circuit 310 according to the first embodiment has the voltage between the voltage corresponding to the ordinary "L" state and the threshold voltage VTH of the inverted signal output circuit 311 in the case of the input signal "H." Accordingly, the switching of the input signal from "H" to "L" causes the output signal of the signal propagation circuit 310 to start to rise from the voltage relatively close to the threshold voltage VTH. Thus, the output signal of the signal propagation circuit 310 can be quickly reached to the threshold voltage VTH compared with the comparative example. The output terminal of the inverted signal output circuit 311 can be charged at a high speed via the configuration of the PMOS transistor and the like included in the negative feedback circuit 312. Accordingly, the output signal of the signal propagation circuit 310 can be risen at a high speed compared with the comparative example. Thus, the loss of the signal as described above can be reduced.

Second Embodiment

Next, a semiconductor memory device according to the second embodiment will be described. The semiconductor memory device according to the second embodiment is basically configured similarly to the semiconductor memory device according to the first embodiment. However, the signal propagation circuit of the semiconductor memory device according to the embodiment includes a signal propagation circuit 320 instead of the signal propagation circuit 310.

Figure 14:
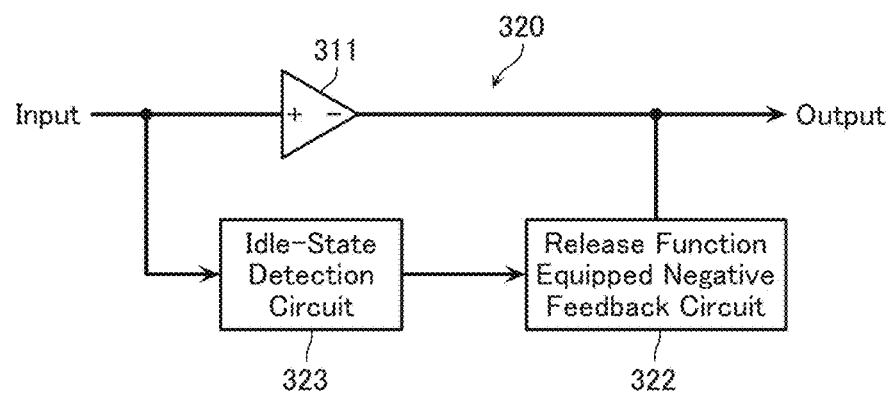
FIG. 14 is a schematic circuit diagram illustrating a configuration of a signal propagation circuit 320 according to a second embodiment.

FIG. 14 is a schematic circuit diagram illustrating a configuration of the signal propagation circuit 320 according to the embodiment. The signal propagation circuit 320 includes an inverted signal output circuit 311, a release function equipped negative feedback circuit 322 connected to an output terminal of the inverted signal output circuit 311, and an idle-state detection circuit 323 (switch signal output circuit) connected to an input terminal of the inverted signal output circuit 311 and an input terminal of the release function equipped negative feedback circuit 322.

Figure 15:
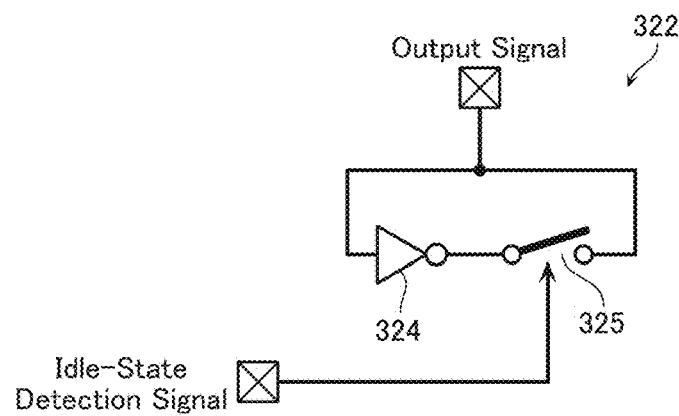
FIG. 15 is a schematic circuit diagram illustrating an exemplary configuration of a release function equipped negative feedback circuit 322.

FIG. 15 is a schematic circuit diagram illustrating an exemplary configuration of the release function equipped negative feedback circuit 322. The release function equipped negative feedback circuit 322 illustrated in FIG. 15 includes an inverted signal output circuit 324 and a switch circuit 325. The inverted signal output circuit 324 includes an input terminal connected to the output terminal of the inverted signal output circuit 311. The switch circuit 325 is connected between an output terminal of the inverted signal output circuit 324 and the output terminal of the inverted signal output circuit 311. The inverted signal output circuit 324 is configured similarly to the inverted signal output circuit 314 described with reference to FIG. 8. The switch circuit 325 may be, for example, a NMOS transistor or a PMOS transistor connected between the output terminal of the inverted signal output circuit 324 and the output terminal of the inverted signal output circuit 311. The switch circuit 325 may be, for example, a NMOS transistor and a PMOS transistor connected between the output terminal of the inverted signal output circuit 324 and the output terminal of the inverted signal output circuit 311 in parallel. The NMOS transistor included in the switch circuit 325 includes a gate electrode to which an output signal (hereinafter referred to as an "idle-state detection signal" in some cases) of the idle-state detection circuit 323 is input. The PMOS transistor included in the switch circuit 325 includes a gate electrode to which an inverted signal of the idle-state detection signal is input.

Figure 16:
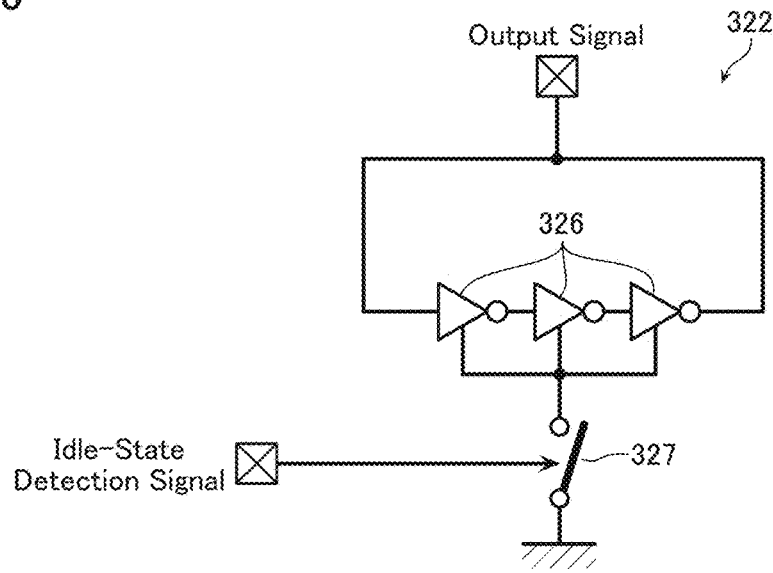
FIG. 16 is a schematic circuit diagram illustrating another exemplary configuration of the release function equipped negative feedback circuit 322.

FIG. 16 is a schematic circuit diagram illustrating another exemplary configuration of the release function equipped negative feedback circuit 322. The release function equipped negative feedback circuit 322 illustrated in FIG. 16 includes an inverted signal output circuit whose input terminal and output terminal are connected to the output terminal of the inverted signal output circuit 311. The inverted signal output circuit includes one or an odd number of cascade connected inverting amplifier circuits 326. The inverting amplifier circuit 326 may be, for example, a CMOS inverter, or may be a NAND circuit, a NOR circuit, and the like. The driving force of the inverting amplifier circuits 326 is smaller than the driving force of the inverted signal output circuit 311. This configuration can be achieved by the adjustment of the number of transistors to be used, the channel width, and the like. The release function equipped negative feedback circuit 322 illustrated in FIG. 16 includes a switch circuit 327 connected between the plurality of inverting amplifier circuits 326 and the voltage apply line configured to apply the ground voltage VSS. While not illustrated, the release function equipped negative feedback circuit 322 includes a switch circuit connected between the plurality of inverting amplifier circuits 326 and the voltage apply line configured to apply the voltage VDD. The not illustrated switch circuit and the switch circuit 327 are configured similarly to the switch circuit 325 described with reference to FIG. 15.

Figure 17:
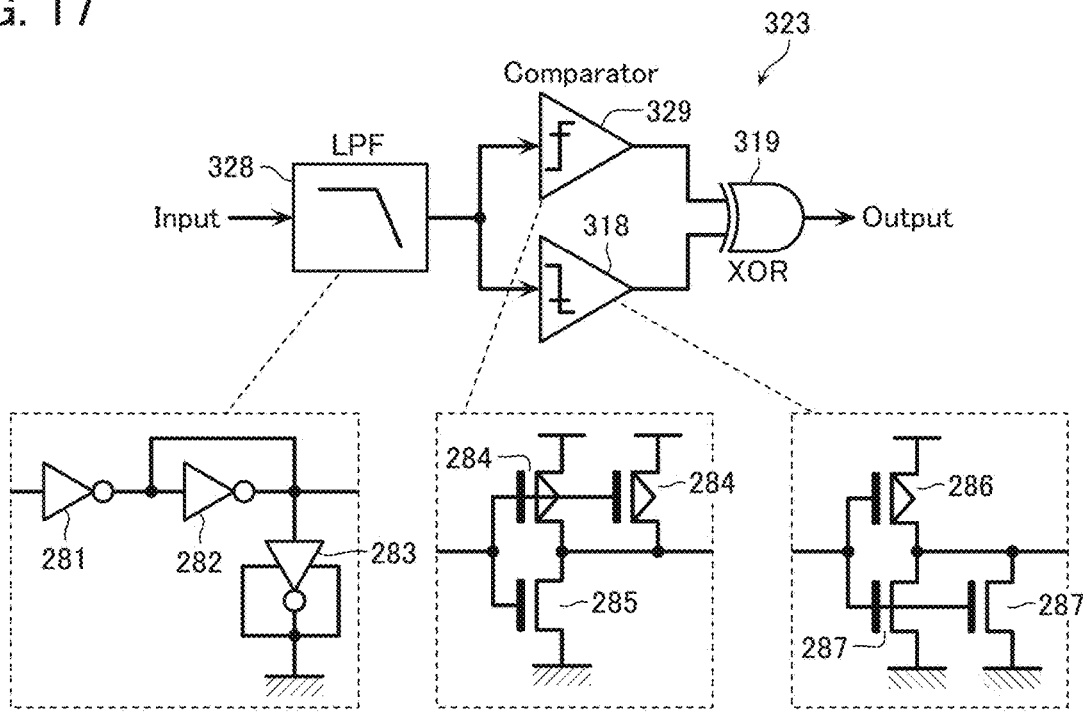
FIG. 17 is a schematic circuit diagram illustrating an exemplary configuration of an idle-state detection circuit 323.

FIG. 17 is a schematic circuit diagram illustrating an exemplary configuration of an idle-state detection circuit 323. The idle-state detection circuit 323 includes a low-pass filter 328, inverting amplifier circuits 329, 318, and a XOR circuit 319. The low-pass filter 328 is connected to the input terminal of the inverted signal output circuit 311. The inverting amplifier circuits 329, 318 are connected to an output terminal of the low-pass filter 328. The XOR circuit 319 is connected to output terminals of the inverting amplifier circuits 329, 318.

The low-pass filter 328 includes, for example, an inverting amplifier circuit 281, an inverting amplifier circuit 282, and an inverting amplifier circuit 283. The inverting amplifier circuit 281 includes an input terminal connected to the input terminal of the inverted signal output circuit 311. The inverting amplifier circuit 282 includes an input terminal connected to an output terminal of the inverting amplifier circuit 281. The inverting amplifier circuit 283 includes an input terminal connected to the input terminal and an output terminal of the inverting amplifier circuit 282. The inverting amplifier circuits 281, 282, and 283 may be, for example, CMOS inverters, or may be NAND circuits, NOR circuits, and the like. The output terminal of the inverting amplifier circuit 282 functions as, for example, the output terminal of the low-pass filter 328. The inverting amplifier circuit 283 includes a power supply terminal and an output terminal connected to the voltage apply line configured to apply the ground voltage VSS. The inverting amplifier circuit 283 functions as, for example, a MOS capacitor configured to include a gate electrode as one electrode and a channel region as the other electrode.

The inverting amplifier circuit 329 includes, for example, a plurality of PMOS transistors 284 and a NMOS transistor 285. The plurality of PMOS transistors 284 are connected between the voltage apply line configured to apply the voltage VDD and an output terminal of the inverting amplifier circuit 329 in parallel. The NMOS transistor 285 is connected between the output terminal and the voltage apply line configured to apply the ground voltage VSS. The plurality of PMOS transistors 284 and the NMOS transistor 285 include gate electrodes connected to an input terminal of the inverting amplifier circuit 329. The inverting amplifier circuit 329 has, for example, a threshold voltage greater than that of the inverted signal output circuit 311.

The inverting amplifier circuit 318 includes, for example, a PMOS transistor 286 and a plurality of NMOS transistors 287. The PMOS transistor 286 is connected between the voltage apply line configured to apply the voltage VDD and an output terminal of the inverting amplifier circuit 318. The plurality of NMOS transistors 287 are connected between the output terminal and the voltage apply line configured to apply the ground voltage VSS in parallel. The PMOS transistor 286 and the plurality of NMOS transistors 287 include gate electrodes connected to an input terminal of the inverting amplifier circuit 318. The inverting amplifier circuit 318 has, for example, a threshold voltage smaller than that of the inverted signal output circuit 311.

Output Signal of Signal Propagation Unit 320

Figure 18:
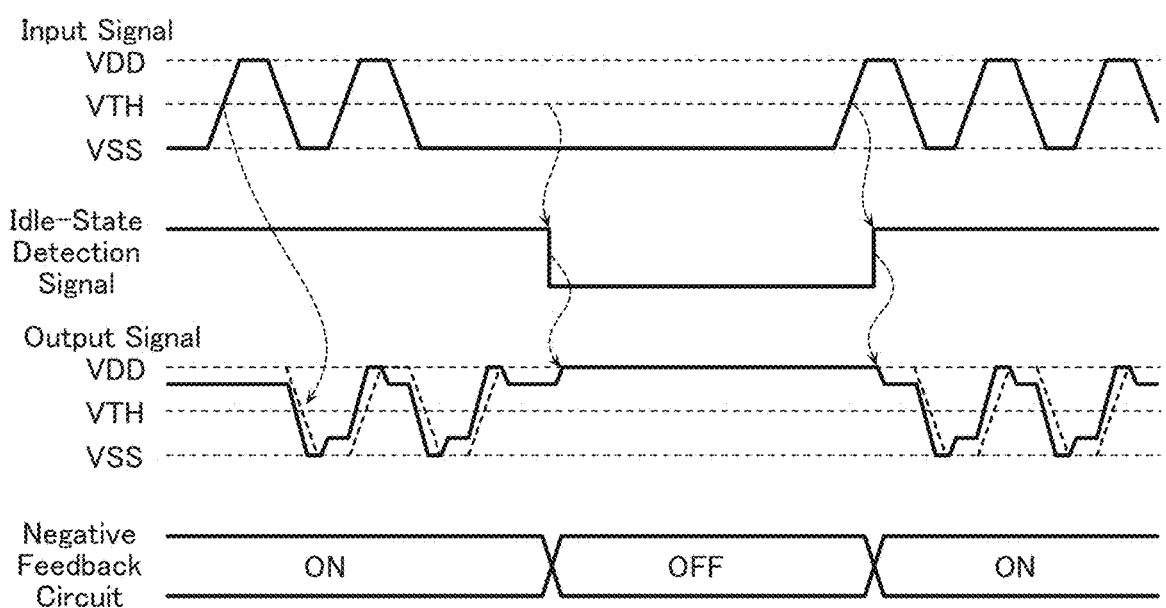
FIG. 18 is a schematic waveform diagram illustrating an input signal and an output signal of the signal propagation circuit 320.

FIG. 18 is a schematic waveform diagram illustrating an input signal and an output signal of the signal propagation circuit 320. In FIG. 18, manufacturing errors of the transistor and the like, attenuation of the signal waveform, or the like are not considered.

In a state where a signal of "L" state and a signal of "H" state are alternately input to the signal propagation circuit 320 (FIG. 14) (hereinafter referred to as a "clock state" in some cases), the low-pass filter 328 of FIG. 17 outputs a voltage smaller than the threshold voltage of the inverting amplifier circuit 329. As a result, the inverting amplifier circuit 329 outputs "H." In this state, the low-pass filter 328 outputs a voltage greater than the threshold voltage of the inverting amplifier circuit 318. As a result, the inverting amplifier circuit 318 outputs "L." Consequently, the XOR circuit 319 outputs "H" and the release function equipped negative feedback circuit 322 (FIG. 14) turns ON. During this period, the signal propagation circuit 320 functions similarly to the signal propagation circuit 310 according to the first embodiment.

In a state where the signal of "L" state is continuously input to the signal propagation circuit 320 (FIG. 14) (hereinafter referred to as an "idle state" in some cases), the low-pass filter 328 of FIG. 17 outputs a voltage smaller than the threshold voltages of the inverting amplifier circuits 329, 318. As a result, the inverting amplifier circuits 329, 318 output "H," the XOR circuit 319 outputs "L," and the release function equipped negative feedback circuit 322 (FIG. 14) turns OFF. During this period, the signal propagation circuit 320 functions similarly to the signal propagation circuit 310' according to the comparative example.

In a state where the signal of "H" state is continuously input to the signal propagation circuit 320 (FIG. 14) (hereinafter referred to as an "idle state" in some cases), the low-pass filter 328 of FIG. 17 outputs a voltage greater than the threshold voltages of the inverting amplifier circuits 329, 318. As a result, the inverting amplifier circuits 329, 318 output "L," the XOR circuit 319 outputs "L," and the release function equipped negative feedback circuit 322 (FIG. 14) turns OFF. During this period, the signal propagation circuit 320 functions similarly to the signal propagation circuit 310' according to the comparative example.

Effect of Semiconductor Memory Device According to Second Embodiment

The signal propagation circuit 310 according to the first embodiment can reduce the loss of the signal as described above. However, the current continues to flow through the signal propagation circuit 310 via the PMOS transistor included in the inverted signal output circuit 311 and the NMOS transistor included in the negative feedback circuit 312, or via the NMOS transistor included in the inverted signal output circuit 311 and the PMOS transistor included in the negative feedback circuit 312, thus possibly causing increase of power consumption.

Therefore, in this embodiment, the signal propagation circuit 320 includes the release function equipped negative feedback circuit 322 and the idle-state detection circuit 323, and the release function equipped negative feedback circuit 322 turns OFF when "H" or "L" is continuously input. Thus, compared with that of the first embodiment, the semiconductor memory device with low power consumption can be provided.

Third Embodiment

Next, a semiconductor memory device according to the third embodiment will be described. The semiconductor memory device according to the third embodiment is basically configured similarly to the semiconductor memory device according to the second embodiment. However, the signal propagation circuit of the semiconductor memory device according to the embodiment includes a signal propagation circuit 330 instead of the signal propagation circuit 320.

Figure 19:
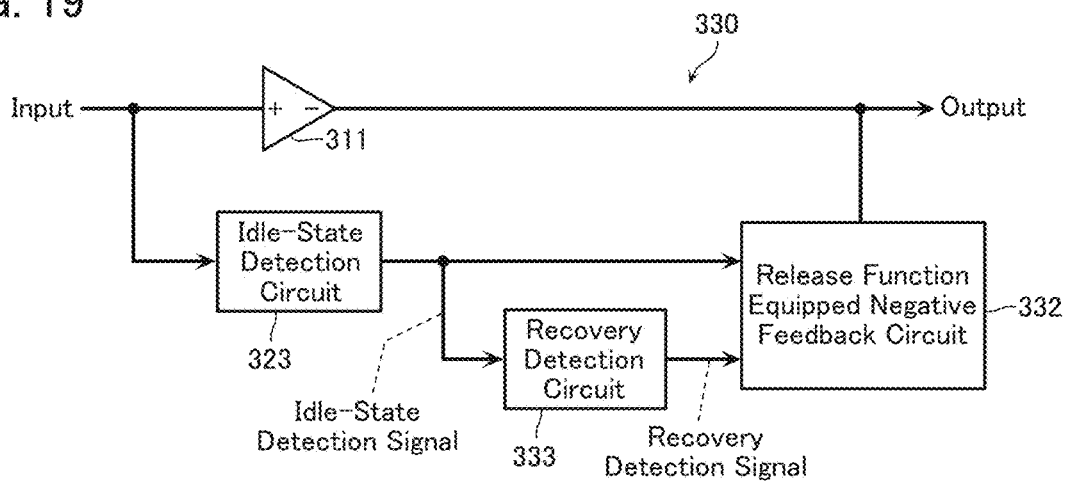
FIG. 19 is a schematic circuit diagram illustrating a configuration of a signal propagation circuit 330 according to a third embodiment.

FIG. 19 is a schematic circuit diagram illustrating a configuration of the signal propagation circuit 330 according to the embodiment. The signal propagation circuit 330 includes an inverted signal output circuit 311, a release function equipped negative feedback circuit 332, an idle-state detection circuit 323, and a recovery detection circuit 333 (switch signal output circuit). The release function equipped negative feedback circuit 332 is connected to an output terminal of the inverted signal output circuit 311. The idle-state detection circuit 323 is connected to an input terminal of the inverted signal output circuit 311 and an input terminal of the release function equipped negative feedback circuit 332. The recovery detection circuit 333 is connected to an output terminal of the idle-state detection circuit 323 and the other input terminal of the release function equipped negative feedback circuit 332.

Figure 20:
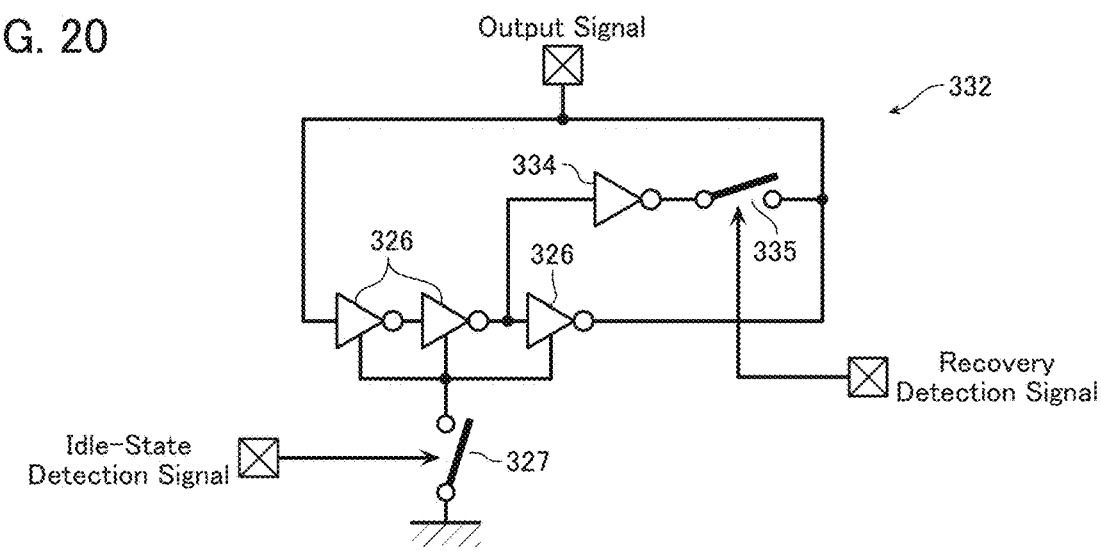
FIG. 20 is a schematic circuit diagram illustrating an exemplary configuration of a release function equipped negative feedback circuit 332.

FIG. 20 is a schematic circuit diagram illustrating an exemplary configuration of the release function equipped negative feedback circuit 332. The release function equipped negative feedback circuit 332 illustrated in FIG. 20 is basically configured similarly to the release function equipped negative feedback circuit 322 described with reference to FIG. 16. However, the release function equipped negative feedback circuit 332 illustrated in FIG. 20 includes an inverting amplifier circuit 334 and a switch circuit 335. The inverting amplifier circuit 334 is connected to the inverting amplifier circuit 326. The switch circuit 335 is connected between an output terminal of the inverting amplifier circuit 334 and an output terminal of the release function equipped negative feedback circuit 332. The inverting amplifier circuit 334 includes an output terminal and an input terminal. For example, the output terminal is connected to an output terminal of the inverting amplifier circuit 326 (hereinafter referred to as a "final-stage inverting amplifier circuit 326" in some cases) whose output terminal is connected to the output terminal of the release function equipped negative feedback circuit 332 among the plurality of cascade connected inverting amplifier circuits 326. For example, the input terminal is connected to an input terminal of the final-stage inverting amplifier circuit 326. The switch circuit 335 is configured similarly to the switch circuit 327 described with reference to FIG. 16. The NMOS transistor included in the switch circuit 335 includes a gate electrode to which an output signal of the recovery detection circuit 333 (hereinafter referred to as a "recovery detection signal" in some cases) is input. The PMOS transistor included in the switch circuit 335 includes a gate electrode to which an inverted signal of the recovery detection signal is input.

Figure 21:
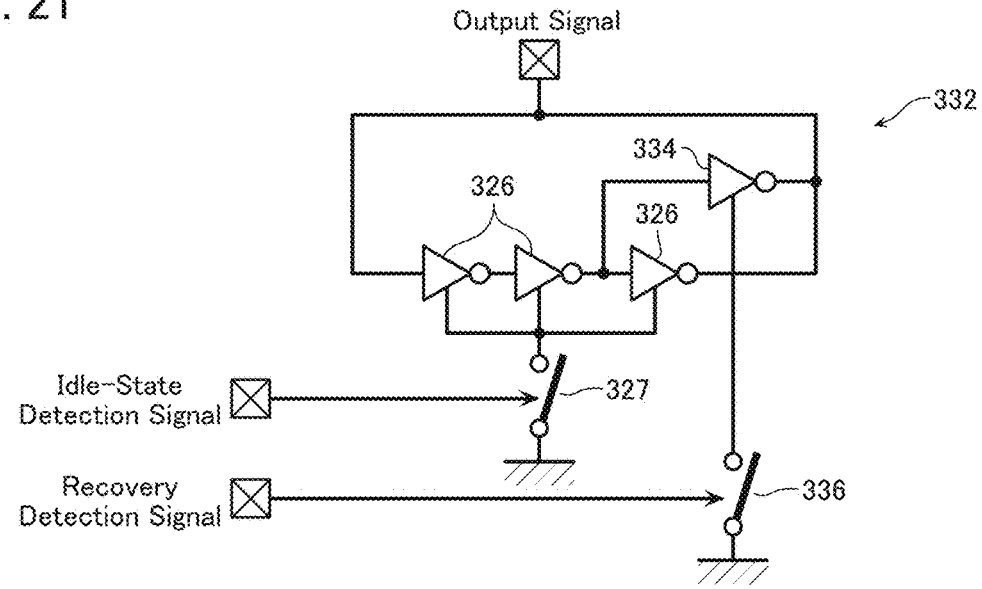
FIG. 21 is a schematic circuit diagram illustrating another exemplary configuration of the release function equipped negative feedback circuit 332.

FIG. 21 is a schematic circuit diagram illustrating another exemplary configuration of the release function equipped negative feedback circuit 332. The release function equipped negative feedback circuit 332 illustrated in FIG. 21 is basically configured similarly to the release function equipped negative feedback circuit 332 described with reference to FIG. 20. However, the release function equipped negative feedback circuit 332 illustrated in FIG. 21 does not include the switch circuit 335 connected between the output terminal of the inverting amplifier circuit 334 and the output terminal of the release function equipped negative feedback circuit 332. The release function equipped negative feedback circuit 332 illustrated in FIG. 21 includes a switch circuit 336 connected between the inverting amplifier circuit 334 and the voltage apply line configured to apply the ground voltage VSS. While not illustrated, the release function equipped negative feedback circuit 332 includes a switch circuit connected between the inverting amplifier circuit 334 and the voltage apply line configured to apply the voltage VDD. The not illustrated switch circuit and the switch circuit 336 are configured similarly to the switch circuit 325 described with reference to FIG. 15. The NMOS transistor included in the switch circuit 336 includes a gate electrode to which the recovery detection signal is input. The PMOS transistor included in the switch circuit 336 includes a gate electrode to which the inverted signal of the recovery detection signal is input.

Figure 22:
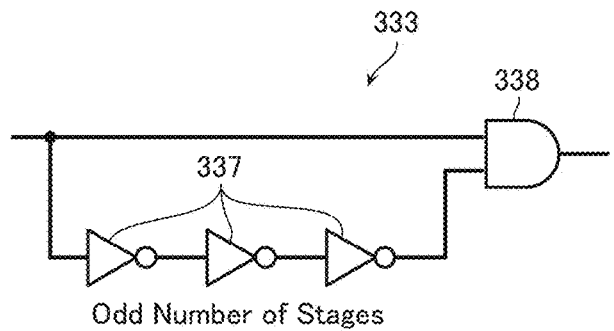
FIG. 22 is a schematic circuit diagram illustrating an exemplary configuration of a recovery detection circuit 333.

FIG. 22 is a schematic circuit diagram illustrating an exemplary configuration of the recovery detection circuit 333. The recovery detection circuit 333 includes an inverted signal output circuit and an AND circuit 338. The inverted signal output circuit is connected to the output terminal of the idle-state detection circuit 323. The AND circuit 338 is connected to the output terminal of the idle-state detection circuit 323 and an output terminal of the inverted signal output circuit. The inverted signal output circuit includes one or an odd number of cascade connected inverting amplifier circuits 337. The inverting amplifier circuits 337 may be, for example, CMOS inverters, or may be NAND circuits, NOR circuits, and the like. The odd number of inverting amplifier circuits 337 function as a delay signal output circuit.

Output Signal of Signal Propagation Unit 330

Figure 23:
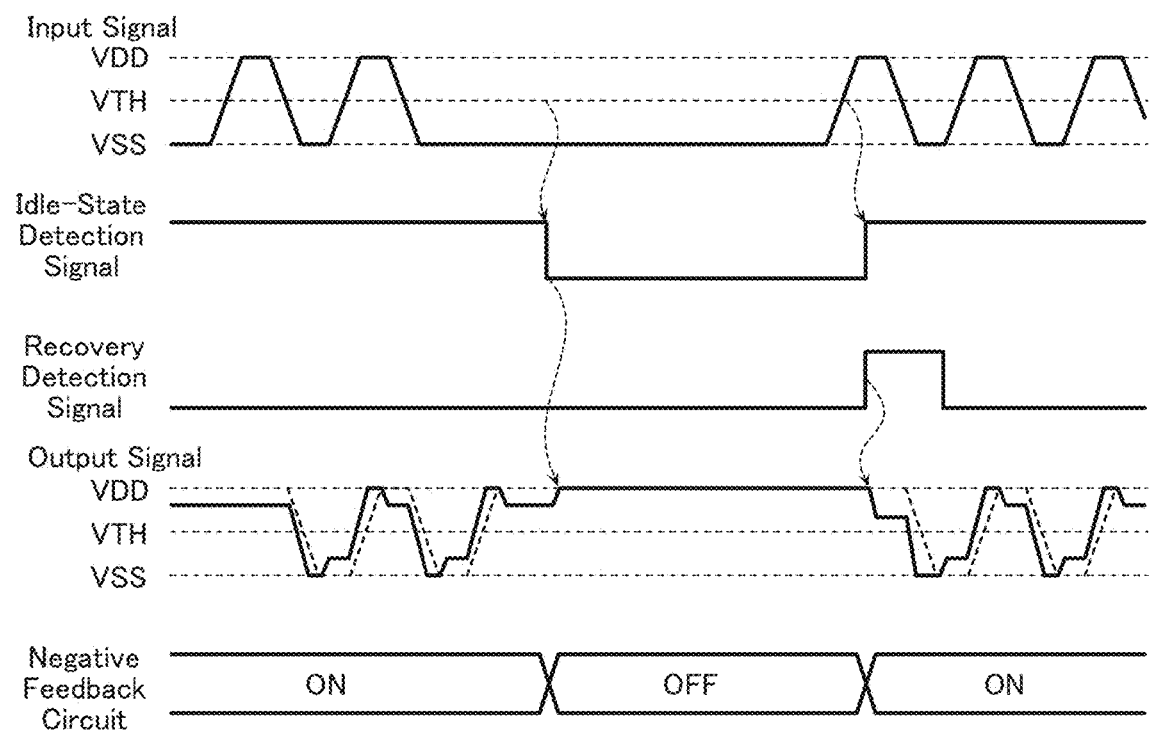
FIG. 23 is a schematic waveform diagram illustrating an input signal and an output signal of the signal propagation circuit 330.

FIG. 23 is a schematic waveform diagram illustrating an input signal and an output signal of the signal propagation circuit 330. In FIG. 23, manufacturing errors of the transistor and the like, attenuation of the signal waveform, or the like are not considered.

When the input signal of the signal propagation circuit 330 (FIG. 19) is in the clock state, the idle-state detection circuit 323 outputs "H." As a result, among the plurality of inverting amplifier circuits 337 of FIG. 22, the inverting amplifier circuit 337 (hereinafter referred to as a "final-stage inverting amplifier circuit 337" in some cases) whose output terminal is connected to the AND circuit 338 outputs "L," and the AND circuit 338 outputs "L." During this period, the signal propagation circuit 330 functions similarly to the signal propagation circuit 320 (FIG. 14).

In a predetermined time period after the switching of the input signal of the signal propagation circuit 330 (FIG. 19) from the clock state to the idle state, the idle-state detection circuit 323 outputs "L" and the final-stage inverting amplifier circuit 337 (FIG. 22) also outputs "L." As a result, the AND circuit 338 outputs "L." During this period, the signal propagation circuit 330 functions similarly to the signal propagation circuit 320 (FIG. 14).

After the elapse of the predetermined time period after the switching of the input signal of the signal propagation circuit 330 (FIG. 19) to the idle state, the idle-state detection circuit 323 outputs "L" and the final-stage inverting amplifier circuit 337 (FIG. 22) outputs "H." As a result, the AND circuit 338 outputs "L." During this period, the signal propagation circuit 330 functions similarly to the signal propagation circuit 320 (FIG. 14).

In a predetermined time period after the switching of the input signal of the signal propagation circuit 330 (FIG. 19) from the idle state to the clock state, the idle-state detection circuit 323 outputs "H" and the final-stage inverting amplifier circuit 337 (FIG. 22) also outputs "H." As a result, the AND circuit 338 outputs "H," and the inverting amplifier circuit 334 (FIG. 20 or FIG. 21) turns ON. Consequently, the driving force of the release function equipped negative feedback circuit 332 is increased compared with the ordinary driving force. For example, as illustrated in FIG. 23, the voltage of the output terminal of the signal propagation circuit 330 has a magnitude close to that of the threshold voltage VTH of the inverted signal output circuit 311 compared with the ordinary voltage. The voltage of the output terminal of the signal propagation circuit 330 is inverted at a speed higher than the ordinary speed.

After the elapse of the predetermined time period after the switching of the input signal of the signal propagation circuit 330 (FIG. 19) to the clock state, the idle-state detection circuit 323 outputs "H," and the final-stage inverting amplifier circuit 337 (FIG. 22) outputs "L." As a result, the AND circuit 338 outputs "L," and the inverting amplifier circuit 334 turns OFF. During this period, the signal propagation circuit 330 functions similarly to the signal propagation circuit 320 (FIG. 14).

Effect of Semiconductor Memory Device According to Third Embodiment

Figure 24:
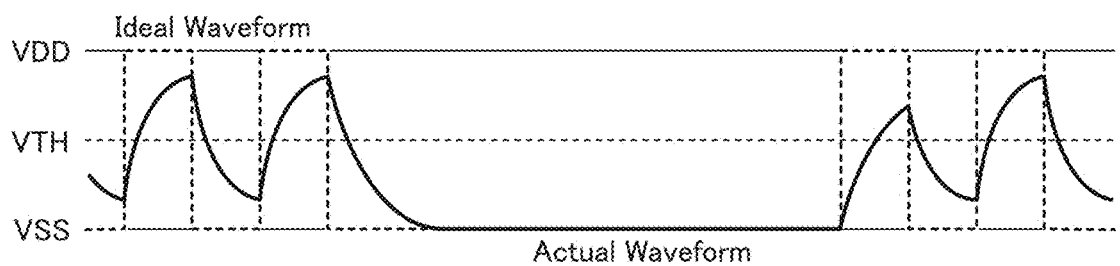
FIG. 24 is a schematic waveform diagram illustrating the input signal and the output signal of the signal propagation circuit 310'.

FIG. 24 is a schematic waveform diagram illustrating an input signal and an output signal of the signal propagation circuit 310'. The waveform diagram of FIG. 24 is a waveform diagram in consideration of the attenuation of signal waveform.

When the input signal of the signal propagation circuit 310' is in the clock state and a clock rate of the input signal is a predetermined rate or more, the voltage of the output terminal starts to increase before the voltage of the output terminal reaches the ground voltage VSS after starting to decrease, and the voltage of the output terminal starts to decrease before the voltage of the output terminal reaches the voltage VDD after starting to increase. As a result, the voltage of the output terminal of the signal propagation circuit 310' varies between the ground voltage VSS and the voltage VDD. Here, when the input signal of the signal propagation circuit 310' is switched to the idle state, for example, when the signal of "L" state is continuously input, as illustrated in FIG. 24, the voltage of the output terminal of the signal propagation circuit 310' is converged to the ground voltage VSS. In this state, when the input signal of the signal propagation circuit 310' is switched to the clock state again, the voltage of the output terminal of the signal propagation circuit 310' starts to increase from the ground voltage VSS and starts to decrease before the voltage of the output terminal reaches the voltage VDD. Here, for example, the voltage of the output terminal of one signal propagation circuit 310' possibly starts to decrease before reaching the threshold voltage VTH. In this case, the signal of the output terminal of another signal propagation circuit 310' connected to the output terminal of this one signal propagation circuit 310' fails to be inverted, thus causing the loss of the signal.

Therefore, in this embodiment, the recovery detection circuit 333 detects the switching of the input signal from the idle state to the clock state, thus keeping the inverting amplifier circuit 334 in the ON state for the predetermined time period. Thus, the output terminal of the signal propagation circuit 330 is charged or discharged at a higher speed at the timing of the switching of the input signal of the signal propagation circuit 330 from the idle state to the clock state, thereby reducing the loss of the signal.

Fourth Embodiment

Figure 25:
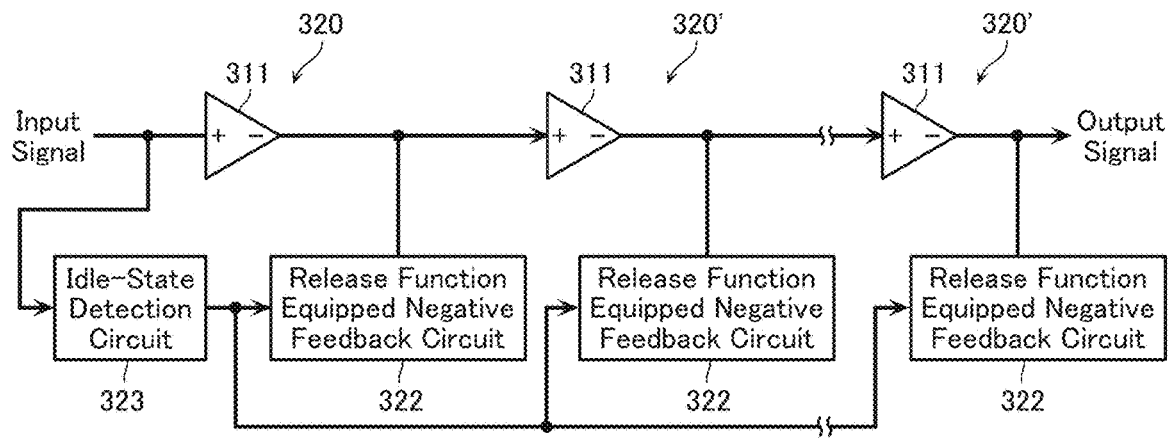
FIG. 25 is a schematic circuit diagram illustrating a configuration of a signal propagation path according to a fourth embodiment.

Next, a semiconductor memory device according to the fourth embodiment will be described. The semiconductor memory device according to the fourth embodiment is basically configured similarly to the semiconductor memory device according to the second embodiment. However, the signal propagation circuit of the semiconductor memory device according to the embodiment includes, as illustrated in FIG. 25, one signal propagation circuit 320 and a plurality of signal propagation circuits 320', which are cascade connected to the signal propagation circuit 320, instead of the cascade connected plurality of signal propagation circuits 320. While the signal propagation circuit 320' is basically configured similarly to the signal propagation circuit 320, the signal propagation circuit 320' does not include the idle-state detection circuit 323. The release function equipped negative feedback circuit 322 included in the signal propagation circuit 320' includes an input terminal connected to the output terminal of the idle-state detection circuit 323 included in the signal propagation circuit 320. This configuration ensures reduction in circuit area compared with the semiconductor memory device according to the second embodiment in some cases.

The signal propagation circuit 320 according to the embodiment may include the recovery detection circuit 333 (FIG. 19, FIG. 22). The signal propagation circuits 320, 320' according to the embodiment may include the release function equipped negative feedback circuits 332 (FIG. 19 to FIG. 21) instead of the release function equipped negative feedback circuit 322. The input terminals of the plurality of release function equipped negative feedback circuits 332 may be connected to the output terminals of the idle-state detection circuit 323 and the recovery detection circuit 333 included in the signal propagation circuit 320.

Fifth Embodiment

Figure 26:
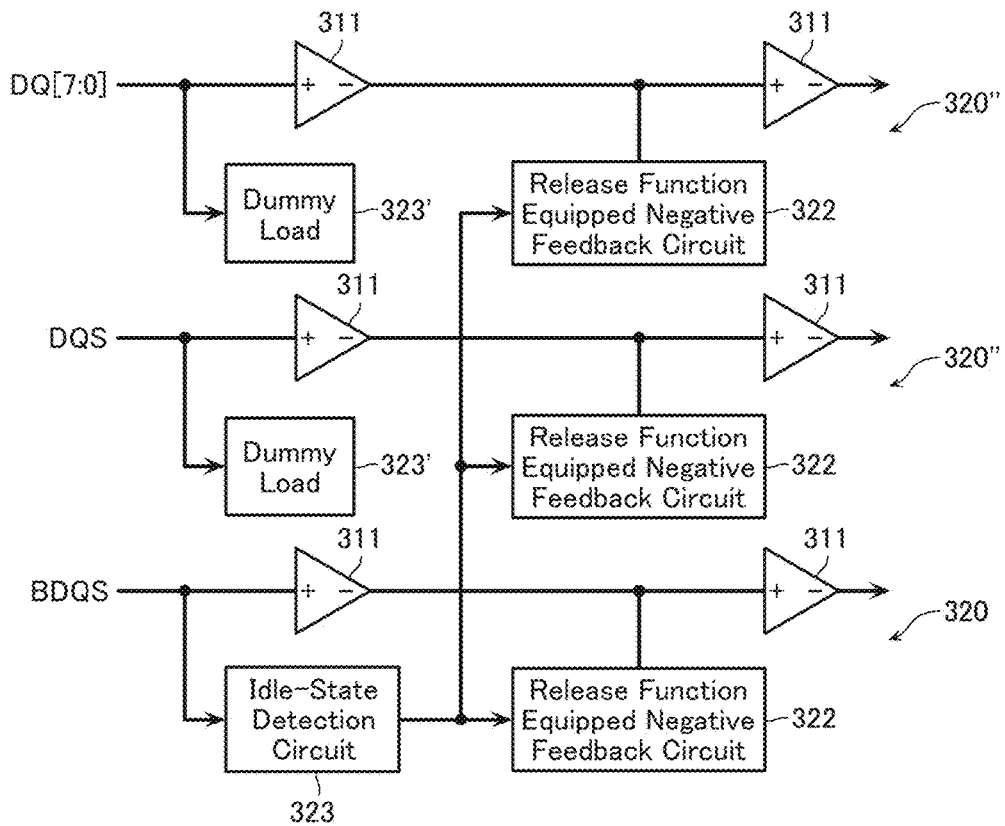
FIG. 26 is a schematic circuit diagram illustrating a configuration of a signal propagation path according to a fifth embodiment.

Next, a semiconductor memory device according to the fifth embodiment will be described. The semiconductor memory device according to the fifth embodiment is basically configured similarly to the semiconductor memory device according to the second embodiment. However, the signal propagation circuit of the semiconductor memory device according to the embodiment includes, as illustrated in FIG. 26, a signal propagation circuit 320 disposed on a predetermined signal propagation path, and signal propagation circuits 320" disposed on other signal propagation paths. While the signal propagation circuit 320" is basically configured similarly to the signal propagation circuit 320, the signal propagation circuit 320" does not include the idle-state detection circuit 323 but includes a dummy load 323' for instead. The dummy load 323' has an input impedance similar to that of the idle-state detection circuit 323. The release function equipped negative feedback circuit 322 included in the signal propagation circuit 320" includes an input terminal connected to the output terminal of the idle-state detection circuit 323 included in the signal propagation circuit 320. This configuration ensures reduction in circuit area compared with the semiconductor memory device according to the second embodiment in some cases.

The signal propagation circuit 320 according to the embodiment may include the recovery detection circuit 333 (FIG. 19, FIG. 22). The signal propagation circuits 320, 320" according to the embodiment may include the release function equipped negative feedback circuits 332 (FIG. 19 to FIG. 21) instead of the release function equipped negative feedback circuit 322. The input terminals of the plurality of release function equipped negative feedback circuits 332 may be connected to the output terminals of the idle-state detection circuit 323 and the recovery detection circuit 333 included in the signal propagation circuit 320.

In the example of FIG. 26, the signal propagation circuit 320 is disposed on the signal propagation path corresponding to the clock signal input/output terminal BDQS, and the signal propagation circuits 320" are disposed on the signal propagation paths corresponding to the data signal input/output terminals DQ0 to DQ7 and the clock signal input/output terminal DQS. However, the signal propagation circuit 320 may be disposed on the signal propagation path corresponding to not the clock signal input/output terminal BDQS but the clock signal input/output terminal DQS. For example, the idle-state detection circuit 323 may be disposed commonly to the clock signal input/output terminals DQS, BDQS, and the idle-state detection circuits 323 may be disposed to the respective data signal input/output terminals DQ0 to DQ7. In the signal propagation circuit 320", the dummy load 323' may be omitted.

Sixth Embodiment

Next, a semiconductor memory device according to the sixth embodiment will be described. The semiconductor memory device according to the sixth embodiment is basically configured similarly to the semiconductor memory device according to the second embodiment. However, the signal propagation circuit of the semiconductor memory device according to the embodiment includes a signal propagation circuit 360 instead of the signal propagation circuit 320.

Figure 27:
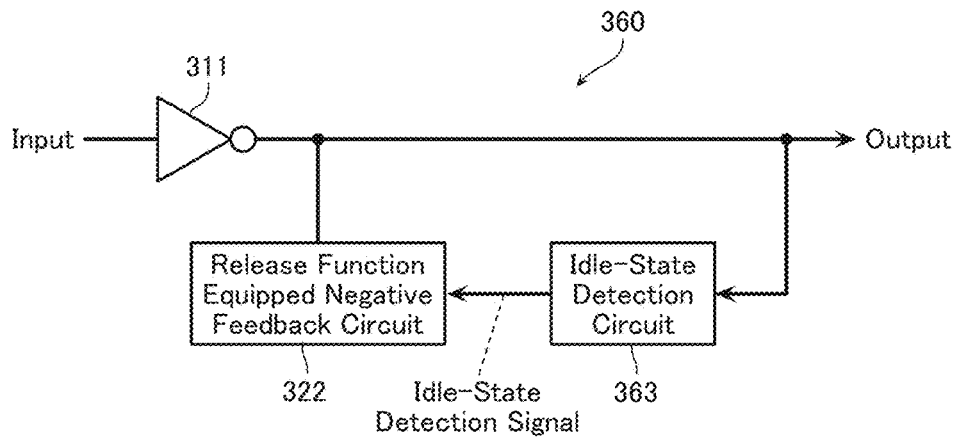
FIG. 27 is a schematic circuit diagram illustrating a configuration of a signal propagation circuit 360 according to a sixth embodiment.

FIG. 27 is a schematic circuit diagram illustrating a configuration of the signal propagation circuit 360 according to the embodiment. The signal propagation circuit 360 is basically configured similarly to the signal propagation circuit 320 (FIG. 14). However, the signal propagation circuit 360 includes an idle-state detection circuit 363 (switch signal output circuit) instead of the idle-state detection circuit 323. The idle-state detection circuit 363 is basically configured similarly to the idle-state detection circuit 323 (FIG. 17). However, the idle-state detection circuit 363 includes an input terminal (input terminal of the low-pass filter 328 of FIG. 17) connected to not the input terminal of the inverted signal output circuit 311 but the output terminal of the inverted signal output circuit 311. The idle-state detection circuit 363 outputs "L" when the input signal is in the clock state, and outputs "H" when the input signal is in the idle state.

Output Signal of Signal Propagation Unit 360

Figure 28:
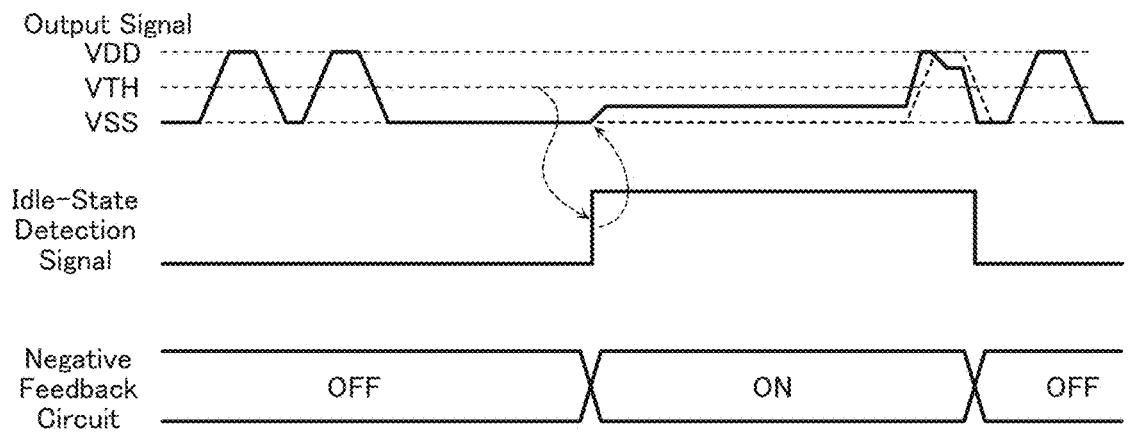
FIG. 28 is a schematic waveform diagram illustrating an input signal and an output signal of the signal propagation circuit 360.

FIG. 28 is a schematic waveform diagram illustrating an input signal and an output signal of the signal propagation circuit 360. In FIG. 28, manufacturing errors of the transistor and the like, attenuation of the signal waveform, or the like are not considered.

When the output signal of the signal propagation circuit 360 is in the clock state, the idle-state detection circuit 363 outputs "L." During this period, the signal propagation circuit 360 functions similarly to the signal propagation circuit 310', and alternately outputs the signal of "L" state and the signal of "H" state.

In a predetermined time period after the switching of the output signal of the signal propagation circuit 360 from the clock state to the idle state, the idle-state detection circuit 363 outputs "L." During this period, the signal propagation circuit 360 functions similarly to the signal propagation circuit 310', and continuously outputs the signal of "L" state or the signal of "H" state.

After the elapse of the predetermined time period after the switching of the output signal of the signal propagation circuit 360 to the idle state, the idle-state detection circuit 363 outputs "H." During this period, the signal propagation circuit 360 functions similarly to the signal propagation circuit 310, and the output voltage of the signal propagation circuit 360 becomes the voltage between the voltage corresponding to the ordinary "L" state and the threshold voltage VTH of the inverted signal output circuit 311, or the voltage between the voltage corresponding to the ordinary "H" state and the threshold voltage VTH of the inverted signal output circuit 311.

In a predetermined time period after the switching of the output signal of the signal propagation circuit 360 from the idle state to the clock state, the idle-state detection circuit 363 outputs "H." During this period, the signal propagation circuit 360 functions similarly to the signal propagation circuit 310, and the output terminal of the signal propagation circuit 310 is charged or discharged at a relatively high speed.

Effect of Semiconductor Memory Device According to Sixth Embodiment

The semiconductor memory device according to the sixth embodiment can reduce the loss of the signal as described with reference to FIG. 24. In the sixth embodiment, both the release function equipped negative feedback circuit 322 and the idle-state detection circuit 363 are connected to the output terminal of the inverted signal output circuit 311. Therefore, the release function equipped negative feedback circuit 322 and the idle-state detection circuit 363 can be disposed in the proximity of the output end of the signal propagation circuit 360 together. Accordingly, compared with the semiconductor memory device according to the second embodiment, the lengths of the wirings connected to the output terminal of the idle-state detection circuit 363 and the input terminal of the release function equipped negative feedback circuit 322 can be reduced, thus ensuring the reduction in circuit area in some cases. Compared with the semiconductor memory device according to the first embodiment, the semiconductor memory device with low power consumption can be provided.

Seventh Embodiment

Next, a semiconductor memory device according to the seventh embodiment will be described. The semiconductor memory device according to the seventh embodiment is basically configured similarly to the semiconductor memory device according to the second embodiment. However, the signal propagation circuit of the semiconductor memory device according to the embodiment includes a signal propagation circuit 370 instead of the signal propagation circuit 320.

Figure 29:
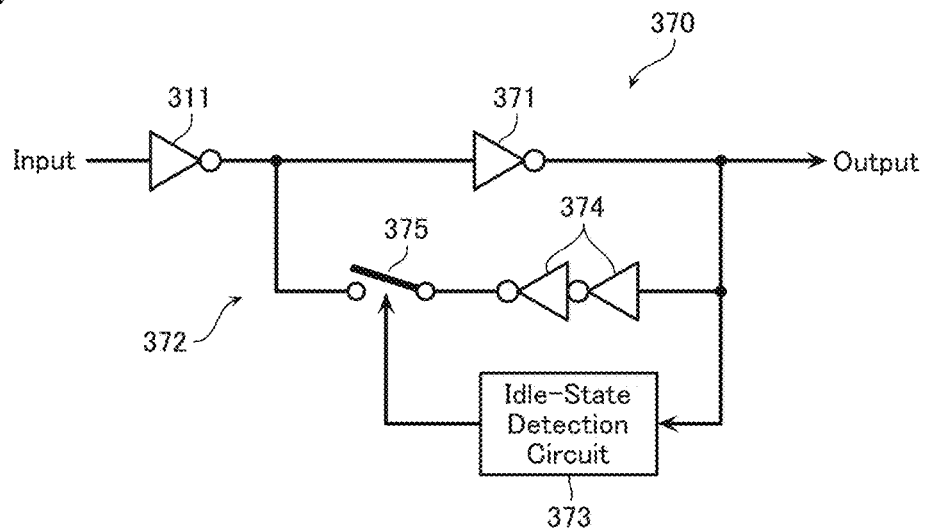
FIG. 29 is a schematic circuit diagram illustrating a configuration of a signal propagation circuit 370 according to a seventh embodiment.

FIG. 29 is a schematic circuit diagram illustrating a configuration of the signal propagation circuit 370 according to the embodiment. The signal propagation circuit 370 includes an inverted signal output circuit 311, an inverted signal output circuit 371, a release function equipped negative feedback circuit 372, and an idle-state detection circuit 373 (switch signal output circuit). The inverted signal output circuit 371 is connected to an output terminal of the inverted signal output circuit 311. The release function equipped negative feedback circuit 372 is connected to the output terminal of the inverted signal output circuit 311. The idle-state detection circuit 373 is connected to an output terminal of the inverted signal output circuit 371 and an input terminal of the release function equipped negative feedback circuit 372.

The inverted signal output circuit 371 is configured similarly to the inverted signal output circuit 311.

For example, as illustrated in FIG. 29, the release function equipped negative feedback circuit 372 may include a non-inverted signal output circuit and a switch circuit 375. The non-inverted signal output circuit includes an input terminal connected to the output terminal of the inverted signal output circuit 371. The switch circuit 375 is connected between an output terminal of the non-inverted signal output circuit and an input terminal of the inverted signal output circuit 371. The non-inverted signal output circuit includes an even number of cascade connected inverting amplifier circuits 374. The inverting amplifier circuit 374 may be, for example, a CMOS inverter, or may be a NAND circuit, a NOR circuit, and the like. The driving force of the inverting amplifier circuits 374 is smaller than the driving force of the inverted signal output circuit 311. This configuration can be achieved by the adjustment of the number of transistors to be used, the channel width, and the like. The switch circuit 375 is configured similarly to the switch circuit 325 described with reference to FIG. 15.

Figure 30:
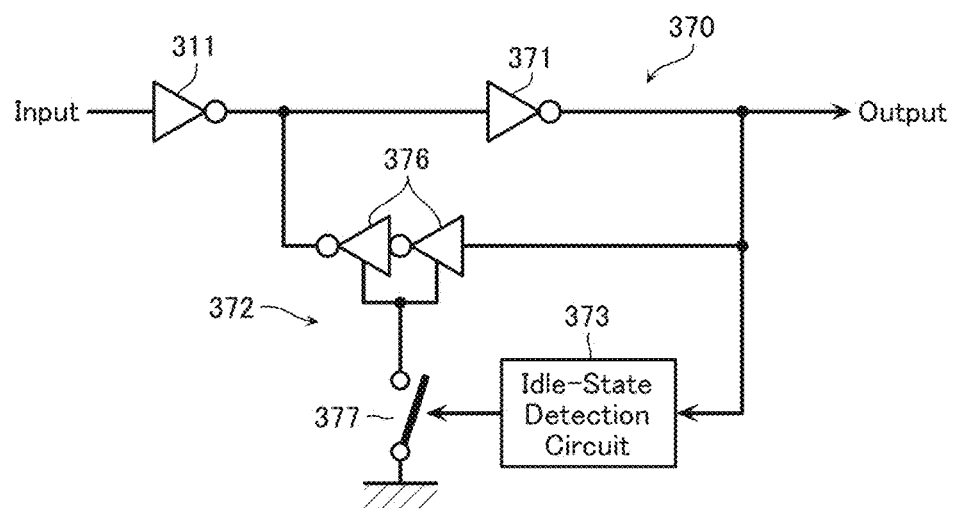
FIG. 30 is a schematic circuit diagram illustrating another configuration of the signal propagation circuit 370 according to the seventh embodiment.

For example, as illustrated in FIG. 30, the release function equipped negative feedback circuit 372 may include a non-inverted signal output circuit configured to include an input terminal connected to the output terminal of the inverted signal output circuit 371 and an output terminal connected to the input terminal of the inverted signal output circuit 371. The non-inverted signal output circuit may include an even number of cascade connected inverting amplifier circuits 376. The inverting amplifier circuits 376 are configured similarly to the inverting amplifier circuits 374 described with reference to FIG. 29. The release function equipped negative feedback circuit 372 includes a switch circuit 377 connected between the plurality of inverting amplifier circuits 376 and the voltage apply line configured to apply the ground voltage VSS. While not illustrated, the release function equipped negative feedback circuit 372 includes a switch circuit connected between the plurality of inverting amplifier circuits 376 and the voltage apply line configured to apply the voltage VDD. The not illustrated switch circuit and the switch circuit 377 are configured similarly to the switch circuit 325 described with reference to FIG. 15.

The idle-state detection circuit 373 is basically configured similarly to the idle-state detection circuit 323 (FIG. 14). However, the idle-state detection circuit 373 includes an input terminal (input terminal of the low-pass filter 328 of FIG. 17) connected to not the input terminal of the inverted signal output circuit 311 but the output terminal of the inverted signal output circuit 371. The idle-state detection circuit 373 outputs "L" when the input signal is in the clock state, and outputs "H" when the input signal is in the idle state.

Effect of Semiconductor Memory Device According to Seventh Embodiment

The semiconductor memory device according to the seventh embodiment can reduce the loss of the signal as described with reference to FIG. 24. For example, in the semiconductor memory device according to the sixth embodiment, as described with reference to FIG. 27, the input terminal of the idle-state detection circuit 363 and the output terminal of the release function equipped negative feedback circuit 322 are connected to the output terminal of the inverted signal output circuit 311. Meanwhile, in the semiconductor memory device according to the embodiment, the input terminal of the release function equipped negative feedback circuit 372 is connected to the output terminal of the inverted signal output circuit 371, and the output terminal of the release function equipped negative feedback circuit 372 is connected to the input terminal of the inverted signal output circuit 371. Accordingly, it is possible to disperse the impedances of the input terminal and the output terminal of the release function equipped negative feedback circuit 372 according to the embodiment. Compared with the first embodiment, the semiconductor memory device with low power consumption can be provided.

Eighth Embodiment

Figure 31:
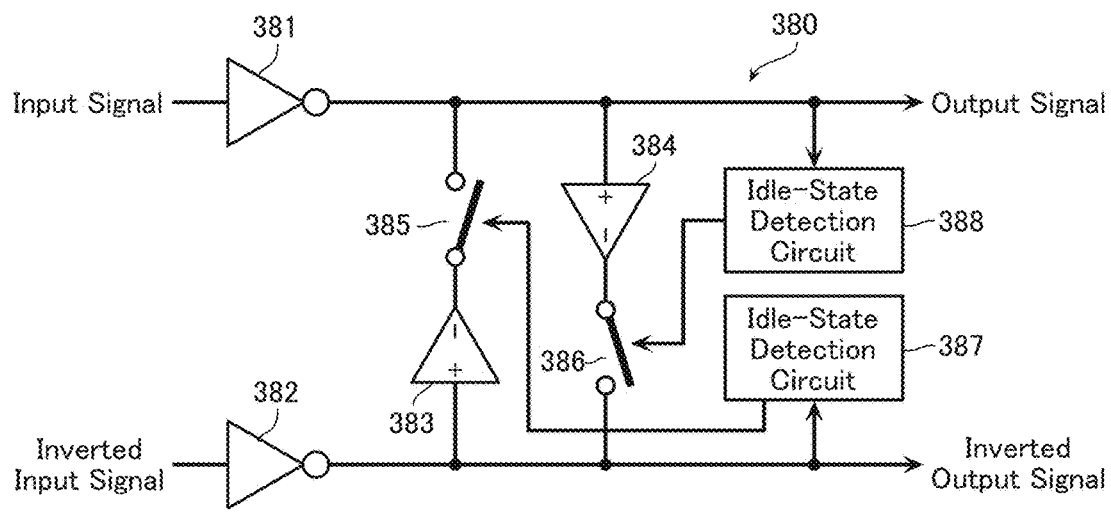
FIG. 31 is a schematic circuit diagram illustrating a configuration of a signal propagation circuit 380 according to an eighth embodiment.

Next, a semiconductor memory device according to the eighth embodiment will be described. FIG. 31 is a schematic circuit diagram illustrating a configuration of a signal propagation circuit 380 according to the eighth embodiment. The semiconductor memory device according to the eighth embodiment includes the signal propagation circuit 380. The signal propagation circuit 380 includes inverted signal output circuits 381, 382. The inverted signal output circuits 381, 382 are configured similarly to the inverted signal output circuit 311 described with reference to FIG. 8.

The signal propagation circuit 380 includes an inverted signal output circuit 383 and an inverted signal output circuit 384. The inverted signal output circuit 383 includes an output terminal connected to an output terminal (signal line) of the inverted signal output circuit 381. The inverted signal output circuit 384 includes an output terminal connected to an output terminal (signal line) of the inverted signal output circuit 382. The inverted signal output circuits 383, 384 are configured similarly to the inverted signal output circuit 314 described with reference to FIG. 8.

The signal propagation circuit 380 includes a switch circuit 385 and a switch circuit 386. The switch circuit 385 is connected between the output terminal of the inverted signal output circuit 383 and the output terminal of the inverted signal output circuit 381. The switch circuit 386 is connected between the output terminal of the inverted signal output circuit 384 and the output terminal of the inverted signal output circuit 382. The switch circuits 385, 386 are configured similarly to the switch circuit 325 described with reference to FIG. 15.

The signal propagation circuit 380 includes an idle-state detection circuit 387 (switch signal output circuit) and an idle-state detection circuit 388 (switch signal output circuit). The idle-state detection circuit 387 is connected to an input terminal of the switch circuit 385 and the output terminal of the inverted signal output circuit 382. The idle-state detection circuit 388 is connected to an input terminal of the switch circuit 386 and the output terminal of the inverted signal output circuit 381. The idle-state detection circuits 387, 388 are configured approximately similarly to the idle-state detection circuit 323 described with reference to FIG. 17.

Figure 32:
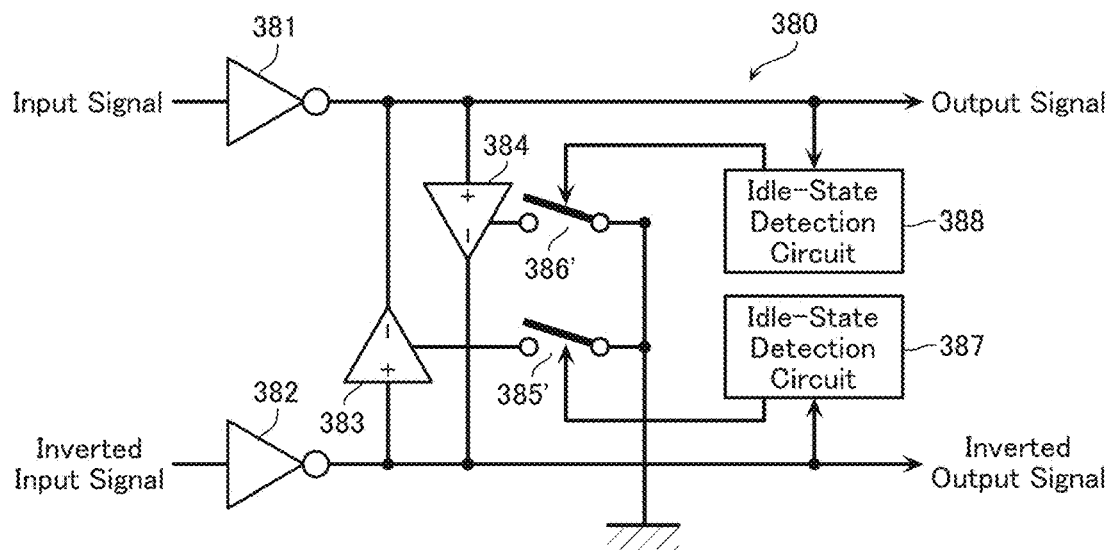
FIG. 32 is a schematic circuit diagram illustrating another configuration of the signal propagation circuit 380 according to the eighth embodiment.

FIG. 32 is a schematic circuit diagram illustrating another exemplary configuration of the signal propagation circuit 380 according to the eighth embodiment. The structure illustrated in FIG. 32 is basically configured similarly to the structure illustrated in FIG. 31. However, the structure illustrated in FIG. 32 does not include the switch circuits 385, 386. The signal propagation circuit 380 illustrated in FIG. 32 includes a switch circuit 385' connected between an inverting amplifier circuit included in the inverted signal output circuit 383 and the voltage apply line configured to apply the ground voltage VSS. While not illustrated, the signal propagation circuit 380 illustrated in FIG. 32 includes a switch circuit connected between the inverting amplifier circuit included in the inverted signal output circuit 383 and the voltage apply line configured to apply the voltage VDD. The signal propagation circuit 380 illustrated in FIG. 32 includes a switch circuit 386' connected between an inverting amplifier circuit included in the inverted signal output circuit 384 and the voltage apply line configured to apply the ground voltage VSS. While not illustrated, the signal propagation circuit 380 illustrated in FIG. 32 includes a switch circuit connected between the inverting amplifier circuit included in the inverted signal output circuit 384 and the voltage apply line configured to apply the voltage VDD. The not illustrated switch circuits and the switch circuits 385', 386' are configured similarly to the switch circuit 325 described with reference to FIG. 15.

Ninth Embodiment

Figure 33:
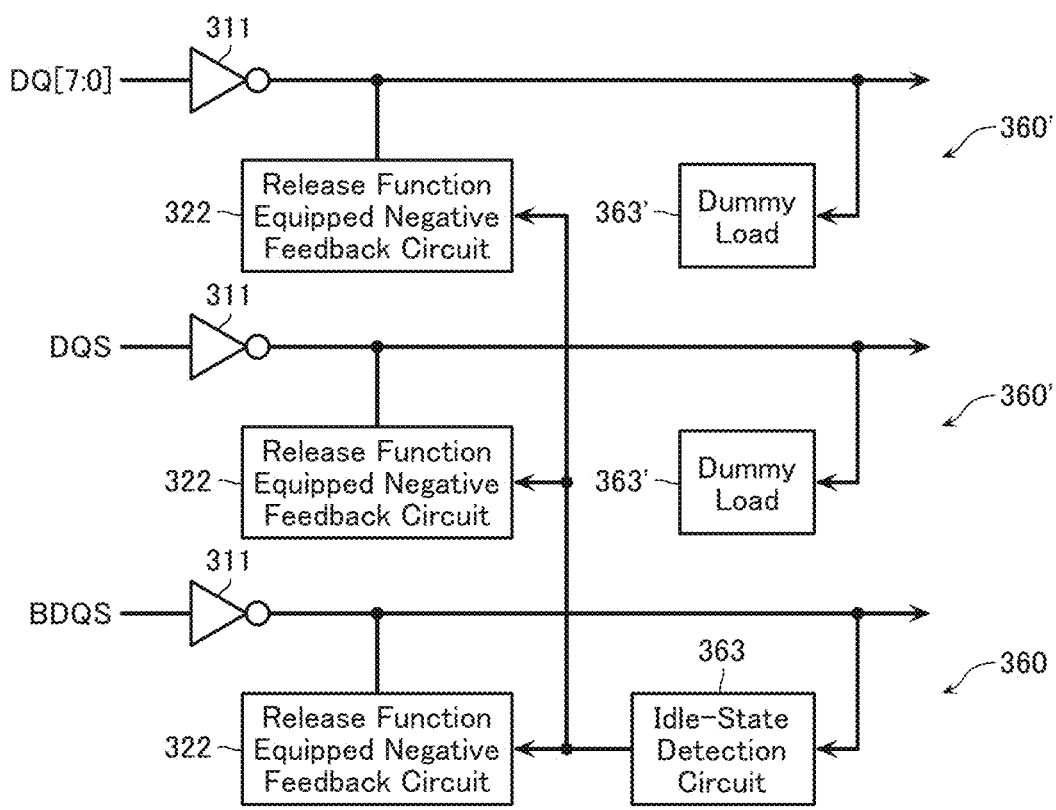
FIG. 33 is a schematic circuit diagram illustrating a configuration of a signal propagation path according to a ninth embodiment.

Next, a semiconductor memory device according to the ninth embodiment will be described. The semiconductor memory device according to the ninth embodiment is basically configured similarly to the semiconductor memory device according to the sixth embodiment. However, the signal propagation circuit of the semiconductor memory device according to the embodiment includes, as illustrated in FIG. 33, a signal propagation circuit 360 disposed on a predetermined signal propagation path and signal propagation circuits 360' disposed on other signal propagation paths. While the signal propagation circuit 360' is basically configured similarly to the signal propagation circuit 360, the signal propagation circuit 360' does not include an idle-state detection circuit 363 but includes a dummy load 363' for instead. The dummy load 363' has an input impedance similar to that of the idle-state detection circuit 363. A release function equipped negative feedback circuit 322 included in the signal propagation circuit 360' is connected to an idle-state detection circuit 363 included in the signal propagation circuit 360. With this configuration, the circuit area can be reduced compared with the semiconductor memory device according to the sixth embodiment in some cases.

In the example of FIG. 33, the signal propagation circuit 360 is disposed on the signal propagation path corresponding to the clock signal input/output terminal BDQS, and the signal propagation circuits 360' are disposed on the signal propagation paths corresponding to the data signal input/output terminals DQ0 to DQ7 and the clock signal input/output terminal DQS. However, the signal propagation circuit 360 may be disposed on the signal propagation path corresponding to not the clock signal input/output terminal BDQS but the clock signal input/output terminal DQS. For example, the idle-state detection circuit 323 may be disposed commonly to the clock signal input/output terminals DQS, BDQS, and the idle-state detection circuit 363 may be disposed for each of the data signal input/output terminals DQ0 to DQ7. In the signal propagation circuit 360', the dummy load 363' may be omitted.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array configured to store data; and
a first signal propagation circuit disposed on a propagation path of a signal corresponding to the data or a propagation path of a control signal input when a read operation or a write operation of the data is performed, wherein the first signal propagation circuit includes:
a first inverted signal output circuit;
a second inverted signal output circuit configured to include an input terminal connected to an output terminal of the first inverted signal output circuit;
a third inverted signal output circuit configured to include an input terminal connected to an output terminal of the second inverted signal output circuit;
a fourth inverted signal output circuit configured to include an input terminal connected to an output terminal of the third inverted signal output circuit and includes an output terminal connected to the input terminal of the second inverted signal output circuit; and
a first switch circuit connected to the fourth inverted signal output circuit,
wherein the first switch circuit is connected between the output terminal of the fourth inverted signal output circuit and the input terminal of the second inverted signal output circuit, or between the fourth inverted signal output circuit and a first voltage apply line,
wherein the first switch circuit turns ON in response to an input of a first signal, and
wherein the first switch circuit turns OFF in response to an input of a second signal.

2. The semiconductor memory device according to claim 1, wherein:
the first to the fourth inverted signal output circuits each include at least one inverted signal output circuit, and
the inverted signal output circuit includes:
a NMOS transistor and a PMOS transistor connected between the first voltage apply line and a second voltage apply line in series;
an input terminal commonly connected to gate electrodes of the NMOS transistor and the PMOS transistor; and
an output terminal commonly connected to drain electrodes of the NMOS transistor and the PMOS transistor.

3. The semiconductor memory device according to claim 1, wherein:
the first signal propagation circuit includes a first switch signal output circuit connected to the first switch circuit,
the first switch signal output circuit includes a low-pass filter configured to include an input terminal connected to the input terminal of the second inverted signal output circuit,
the first switch signal output circuit outputs the first signal to the first switch circuit when an output signal of the low-pass filter is greater than a first threshold and smaller than a second threshold, and
the first switch signal output circuit outputs the second signal to the first switch circuit when the output signal of the low-pass filter is smaller than the first threshold and when the output signal of the low-pass filter is greater than the second threshold.

4. A semiconductor memory device comprising:
a memory cell array configured to store data; and
a first signal propagation circuit disposed on a propagation path of a signal corresponding to the data or a propagation path of a control signal input when a read operation or a write operation of the data is performed,
wherein the first signal propagation circuit includes:
first and second signal lines;
a first inverted signal output circuit configured to include an input terminal connected to the first signal line and an output terminal connected to the second signal line;
a second inverted signal output circuit configured to include an input terminal connected to the second signal line and an output terminal connected to the first signal line;
a first switch circuit connected to the first inverted signal output circuit; and
a second switch circuit connected to the second inverted signal output circuit,
wherein the first switch circuit is connected between the output terminal of the first inverted signal output circuit and the second signal line, or between the first inverted signal output circuit and a first voltage apply line, wherein the second switch circuit is connected between the output terminal of the second inverted signal output circuit and the first signal line, or between the second inverted signal output circuit and the first voltage apply line, wherein the first switch circuit and the second switch circuit turn ON in response to an input of a first signal, and wherein the first switch circuit and the second switch circuit turn OFF in response to an input of a second signal.

5. The semiconductor memory device according to claim 4, wherein:

the first and the second inverted signal output circuits each include at least one inverted signal output circuit, and the inverted signal output circuit includes:
- a NMOS transistor and a PMOS transistor connected between the first voltage apply line and a second voltage apply line in series;
- an input terminal commonly connected to gate electrodes of the NMOS transistor and the PMOS transistor; and
- an output terminal commonly connected to drain electrodes of the NMOS transistor and the PMOS transistor.

6. The semiconductor memory device according to claim 4, wherein:

the first signal propagation circuit includes a first switch signal output circuit connected to at least one of the first switch circuit and the second switch circuit, the first switch signal output circuit includes a low-pass filter configured to include an input terminal connected to the first or the second signal line, the first switch signal output circuit outputs the first signal to at least one of the first switch circuit and the second switch circuit when an output signal of the low-pass filter is greater than a first threshold and smaller than a second threshold, and the first switch signal output circuit outputs the second signal to at least one of the first switch circuit and the second switch circuit when the output signal of the low-pass filter is smaller than the first threshold and when the output signal of the low-pass filter is greater than the second threshold.

* * * * *